United States Patent
Sugaya et al.

(10) Patent No.: US 10,153,128 B2
(45) Date of Patent: Dec. 11, 2018

(54) CHARGED PARTICLE BEAM APPARATUS AND SAMPLE ELEVATING APPARATUS

(71) Applicant: HITACHI HIGH-TECHNOLOGIES CORPORATION, Minato-ku, Tokyo (JP)

(72) Inventors: Masakazu Sugaya, Tokyo (JP); Yusuke Moriwaki, Tokyo (JP); Koichi Terada, Tokyo (JP); Nobuo Shibata, Tokyo (JP); Hironori Ogawa, Tokyo (JP); Hiroyuki Kitsunai, Tokyo (JP); Toshihiko Shimizu, Tokyo (JP); Shuichi Nakagawa, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/574,773

(22) PCT Filed: Apr. 22, 2016

(86) PCT No.: PCT/JP2016/062779
§ 371 (c)(1),
(2) Date: Nov. 16, 2017

(87) PCT Pub. No.: WO2016/185872
PCT Pub. Date: Nov. 24, 2016

(65) Prior Publication Data
US 2018/0138009 A1 May 17, 2018

(30) Foreign Application Priority Data
May 18, 2015 (JP) ................................ 2015-100942

(51) Int. Cl.
*H01J 37/20* (2006.01)
*G01N 23/225* (2018.01)
(Continued)

(52) U.S. Cl.
CPC .............. *H01J 37/20* (2013.01); *H01J 37/29* (2013.01); *H01J 2237/20285* (2013.01)

(58) Field of Classification Search
USPC ..... 250/440.11, 442.11, 491.1, 492.1, 492.2, 250/526
See application file for complete search history.

(56) References Cited

U.S. PATENT DOCUMENTS

| | | | | |
|---|---|---|---|---|
| 2004/0222387 A1* | 11/2004 | Loda | ......................... | G21K 5/10 250/492.1 |
| 2011/0260057 A1* | 10/2011 | Otaka | ..................... | H01J 37/20 250/307 |
| 2015/0255246 A1* | 9/2015 | Watanabe | ............. | H01J 37/261 250/311 |

FOREIGN PATENT DOCUMENTS

JP         10-3874 A    1/1998

* cited by examiner

*Primary Examiner* — Bernard Souw
(74) *Attorney, Agent, or Firm* — Miles & Stockbridge P.C.

(57) ABSTRACT

To realize a sample lifting and lowering device capable of easily responding to increase of a diameter of a sample with light weight and high rigidity as well as with less directional dependence of rigidity as the sample lifting lowering device arranged above a horizontal movement mechanism. The sample lifting and lowering device includes first and second lifting and lowering mechanisms that lift and lower a sample stage to which the sample is fixed, first and second driving devices that drive the first and second lifting and lowering mechanisms to be lifted and lowered individually and a controller that synchronizes lifting/lowering operations of the first and second lifting and lowering mechanisms by the first and second driving devices by first and second control signals, in which the first lifting and lowering mechanism includes a first deceleration mechanism generating a first drive output obtained by decelerating a first drive input
(Continued)

given from the first driving device in a direction different from a direction of the input, the second lifting and lowering mechanism includes a second deceleration mechanism generating a second drive output obtained by decelerating a second drive input given from the second driving device in a direction different from a direction of the input, and directions of the first and second drive inputs are different from each other as well as are not on the same straight line.

15 Claims, 25 Drawing Sheets

(51) Int. Cl.
*F41J 7/00* (2006.01)
*F41J 3/00* (2006.01)
*E02B 17/08* (2006.01)
*G21K 5/08* (2006.01)
*H01J 37/29* (2006.01)

[FIG. 1]
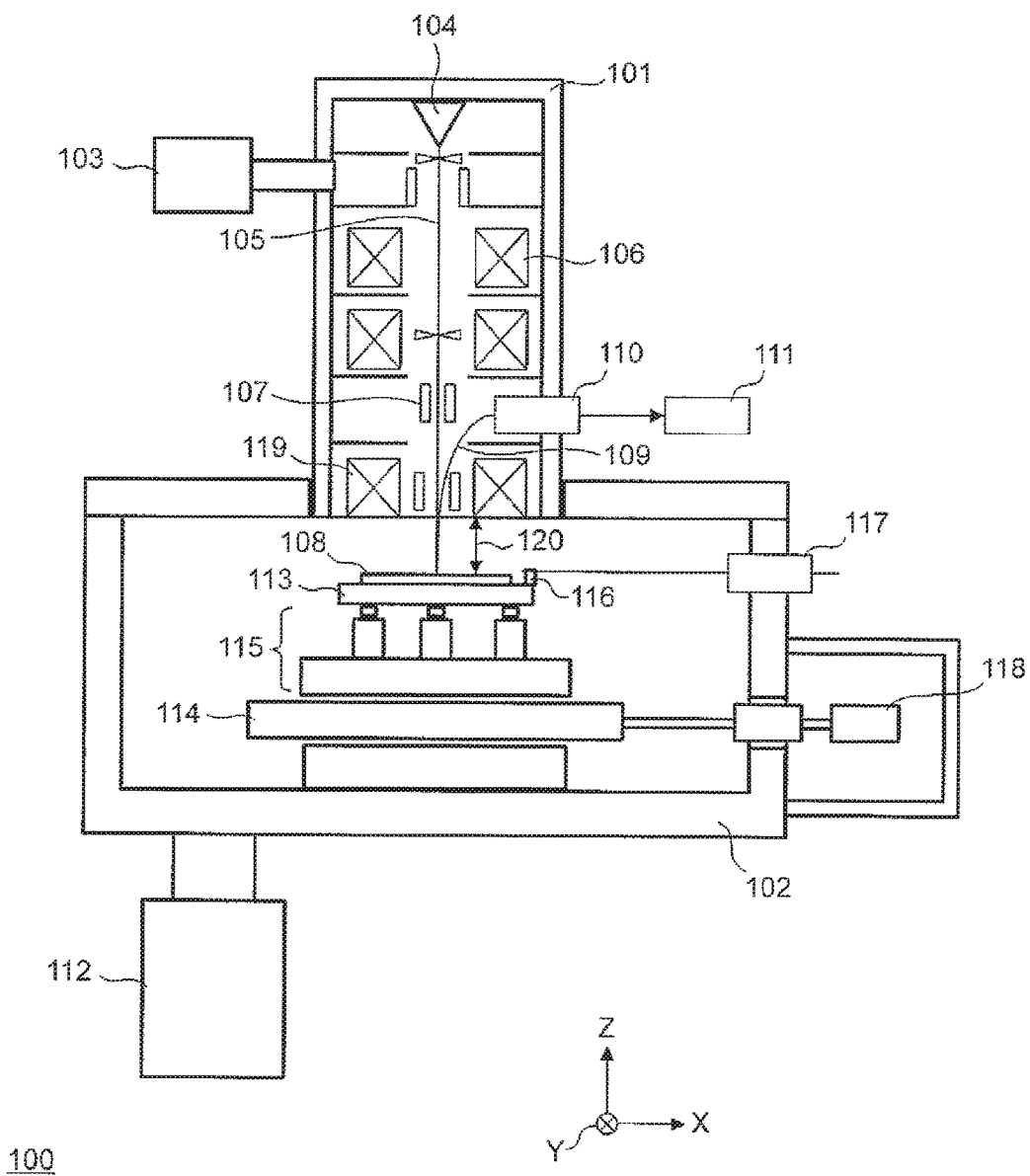

[FIG. 2]
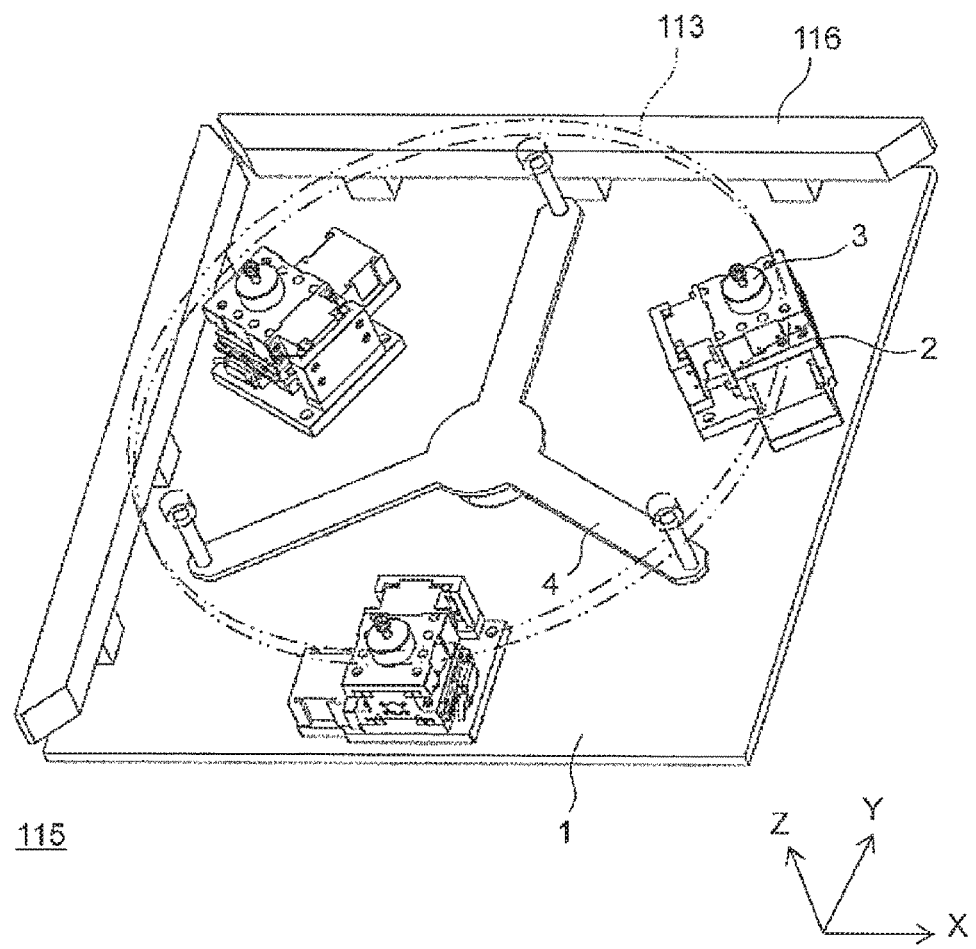

[FIG. 3]
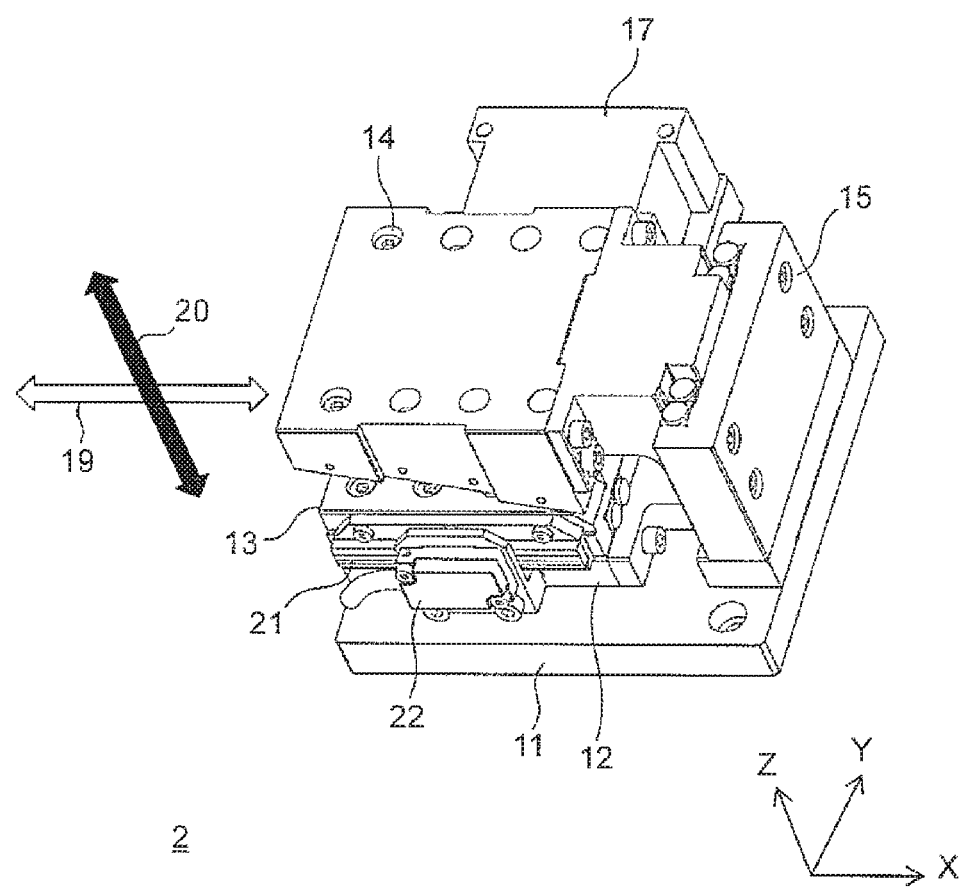

[FIG. 4]
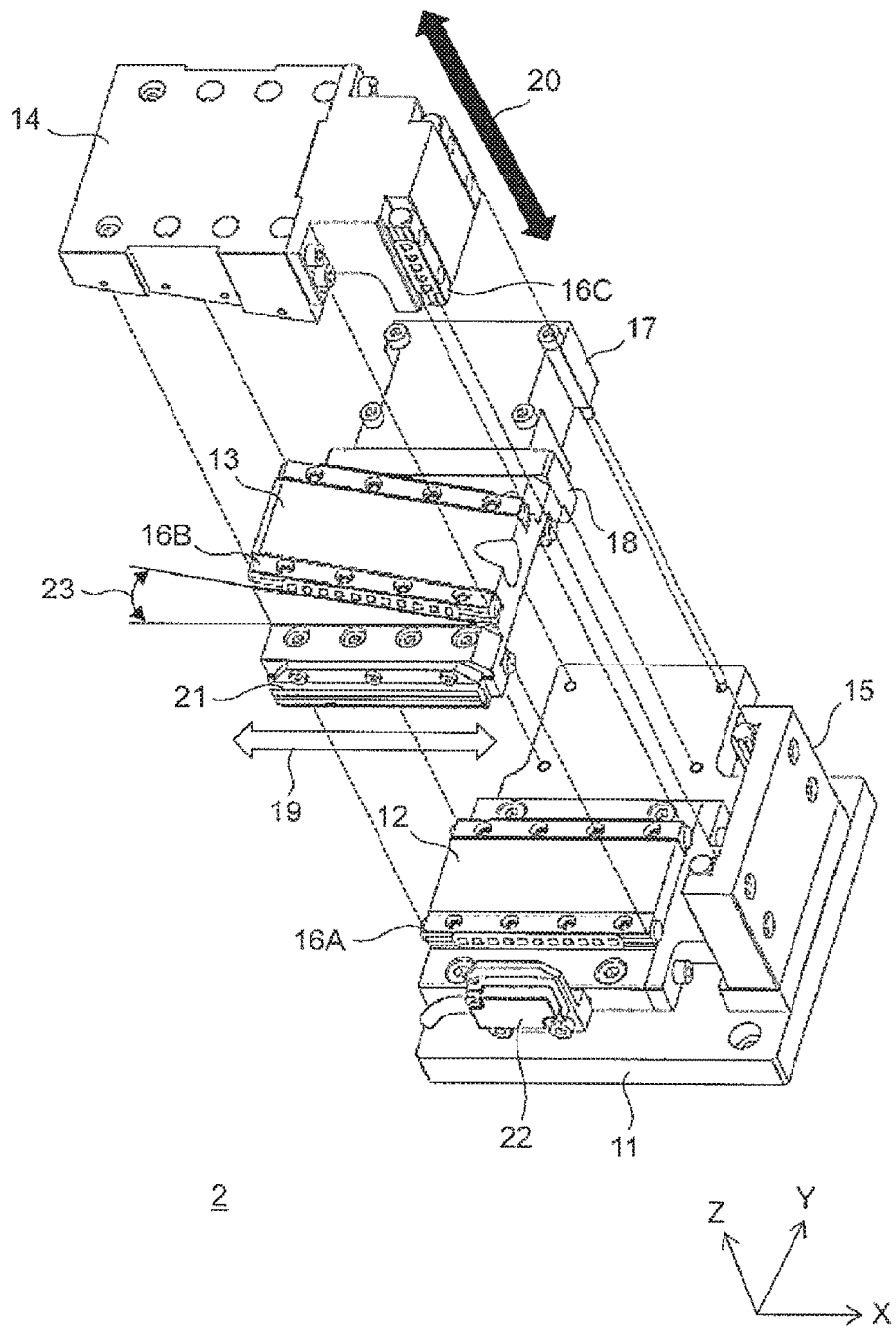

[FIG. 5A]
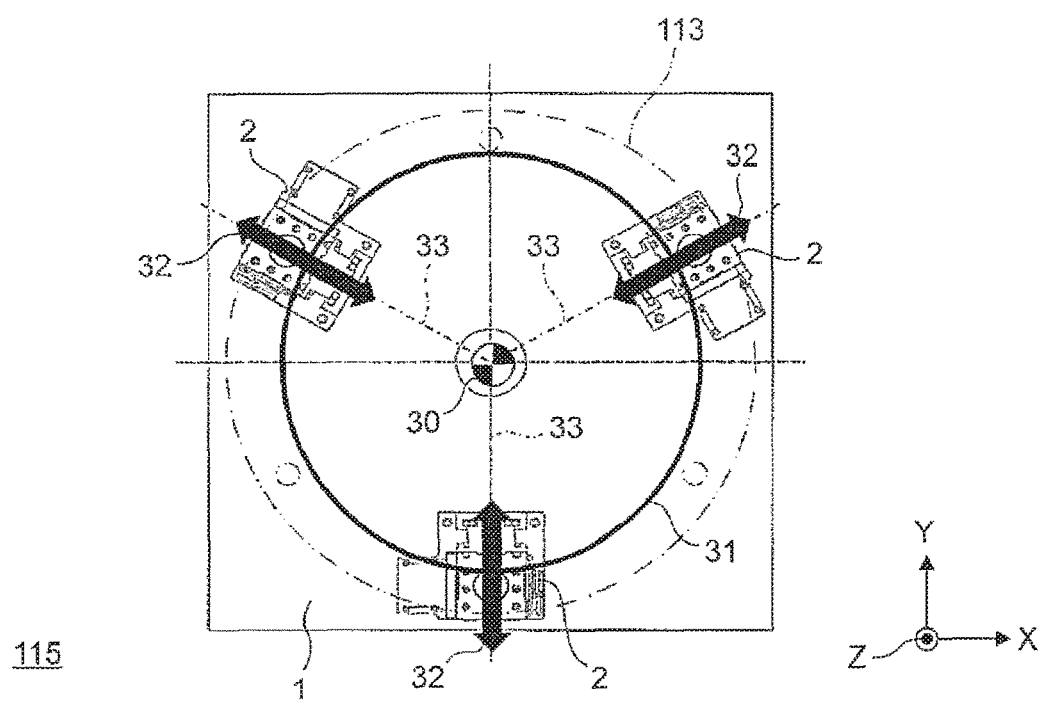

[FIG. 5B]
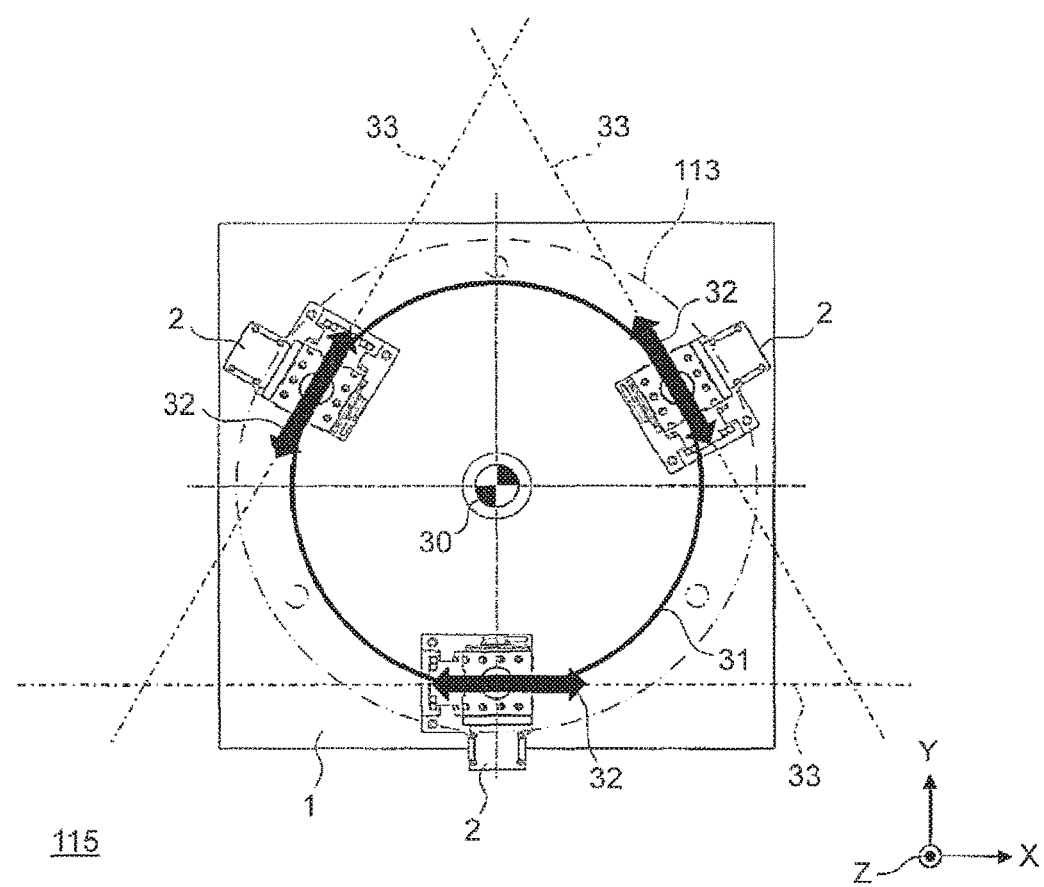

[FIG. 6]
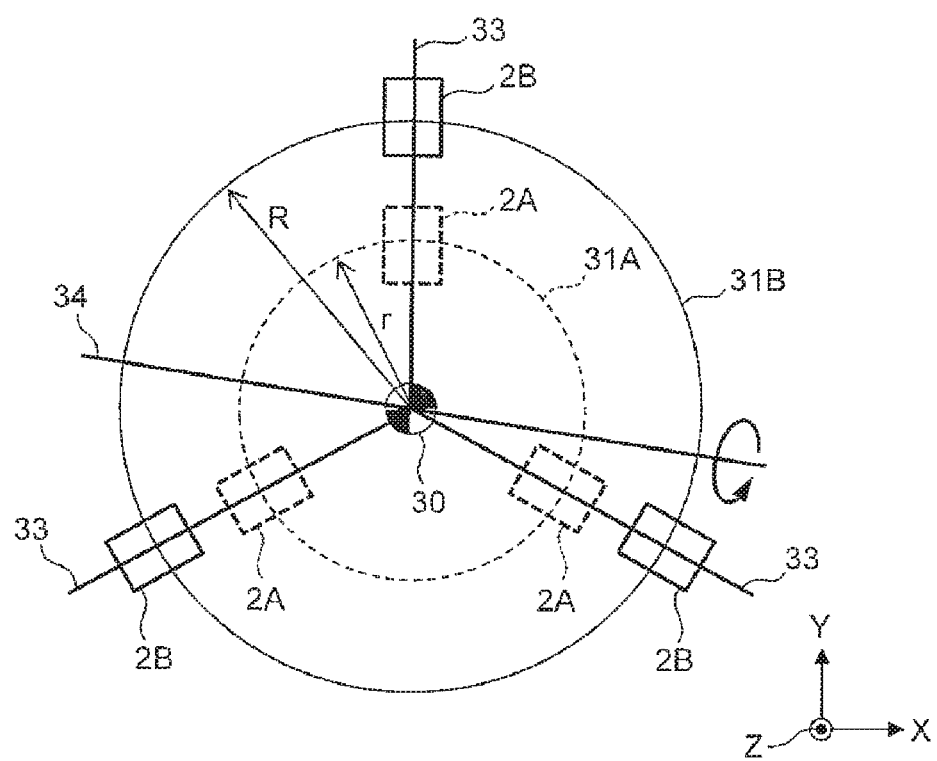

[FIG. 7]
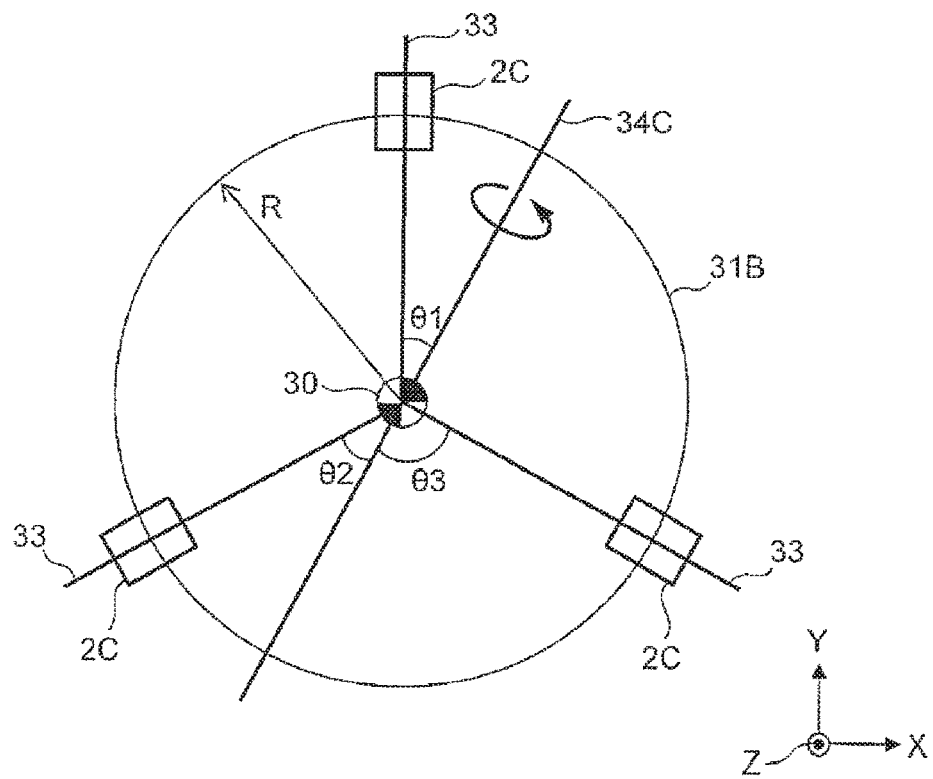

[FIG. 8]
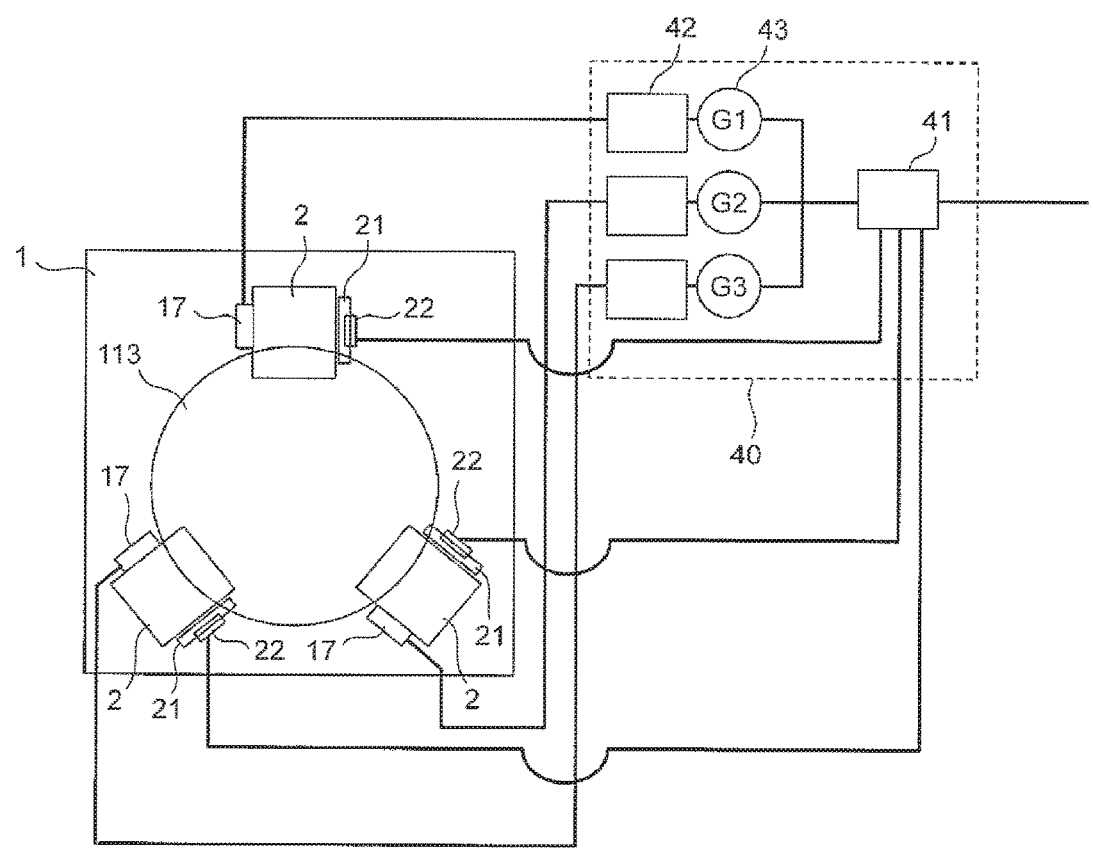

[FIG. 9]
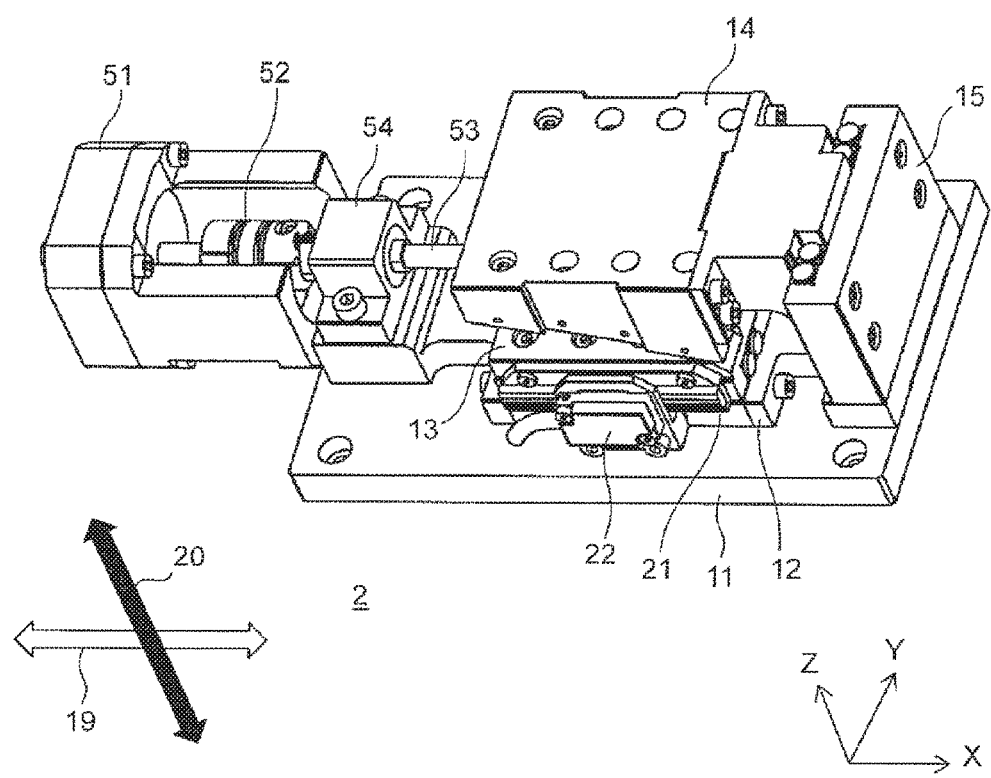

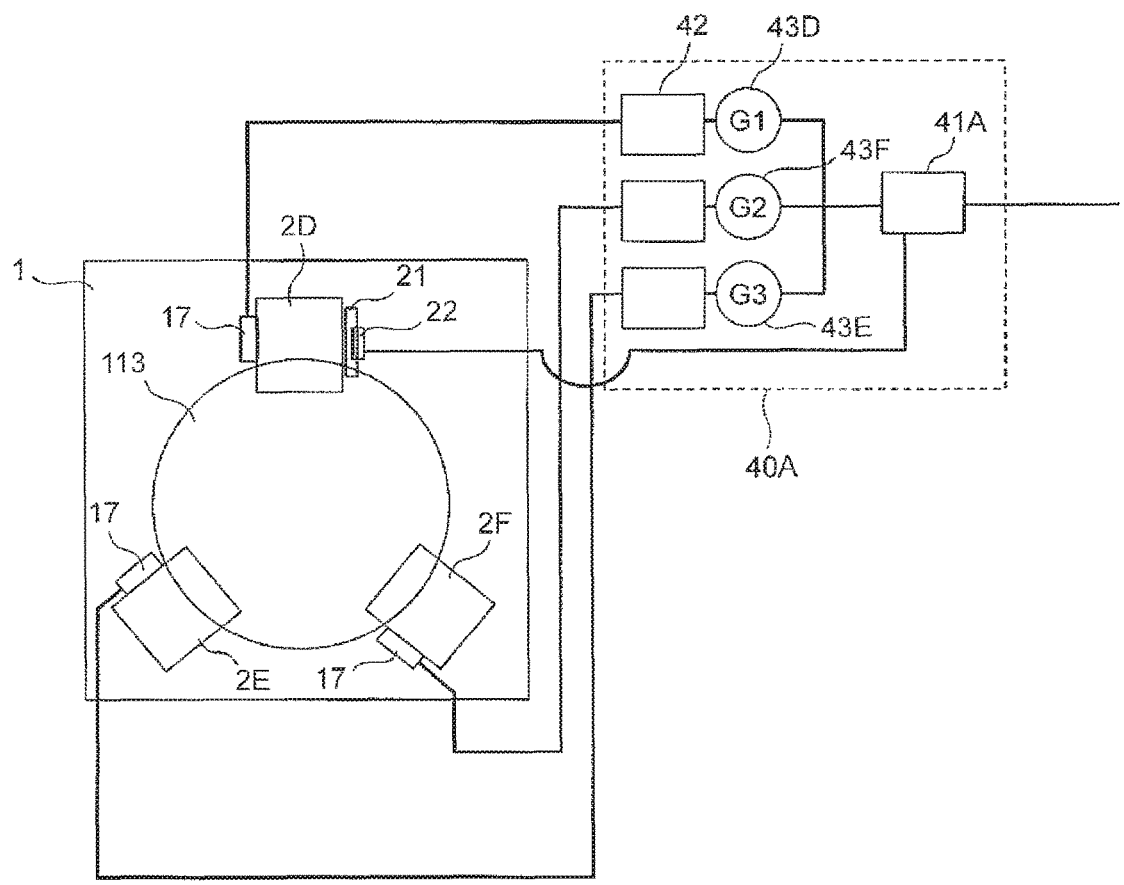
[FIG. 10]

[FIG. 11]
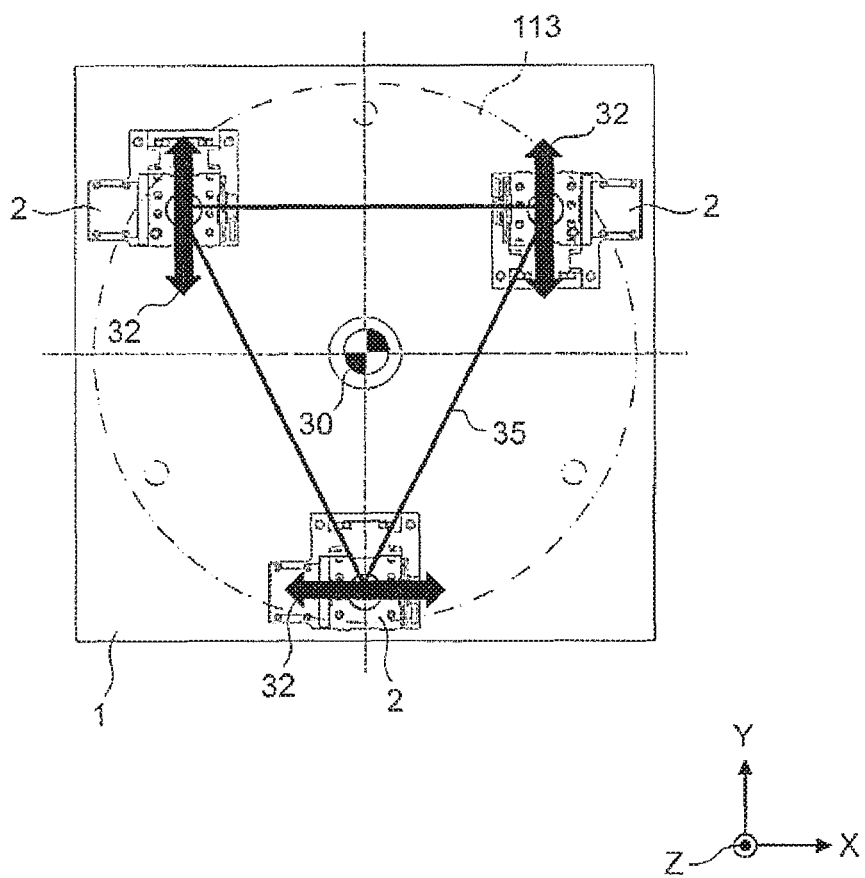

[FIG. 12]
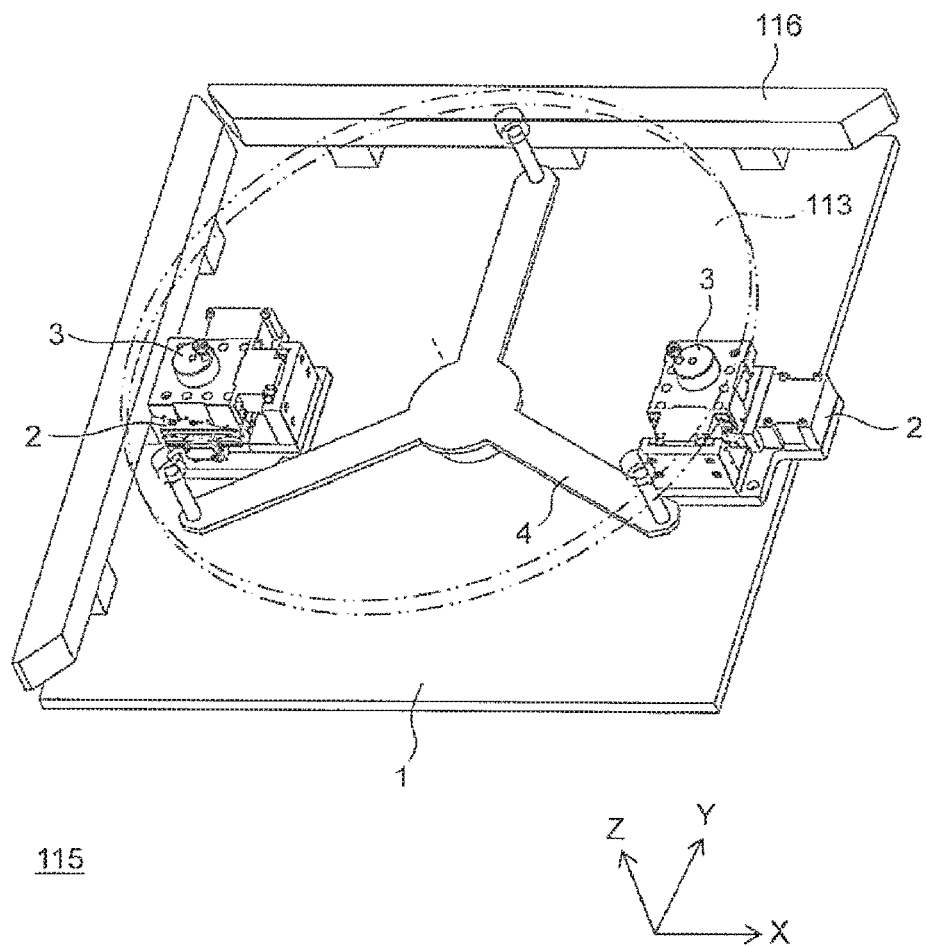

[FIG. 13A]
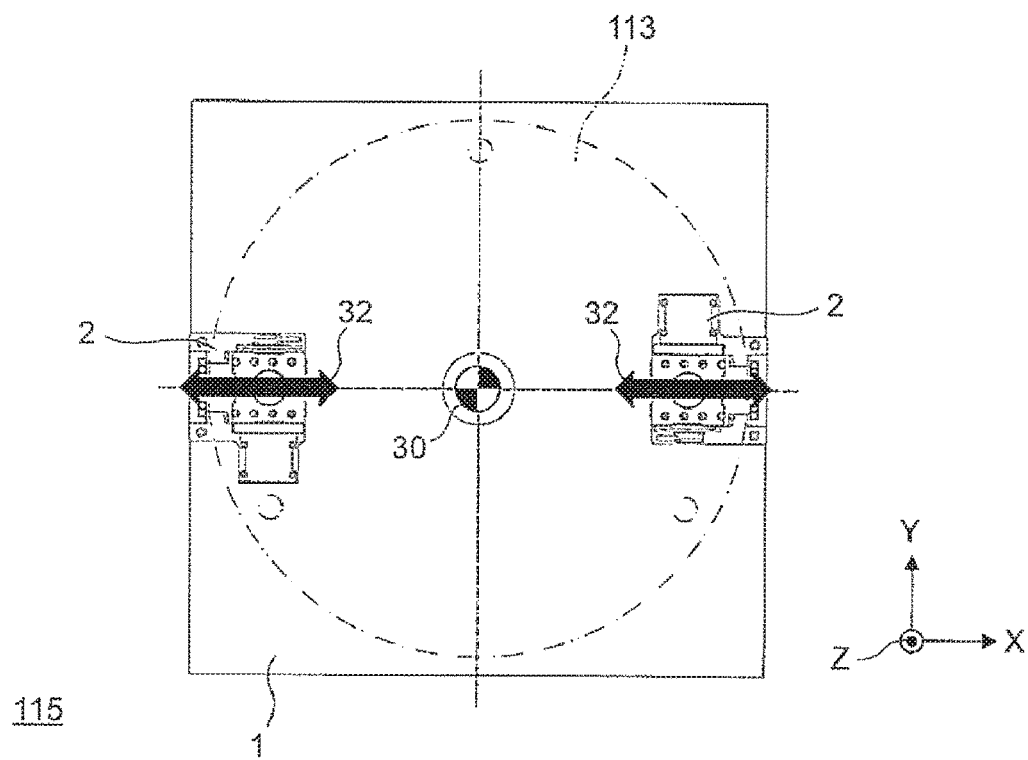

[FIG. 13B]
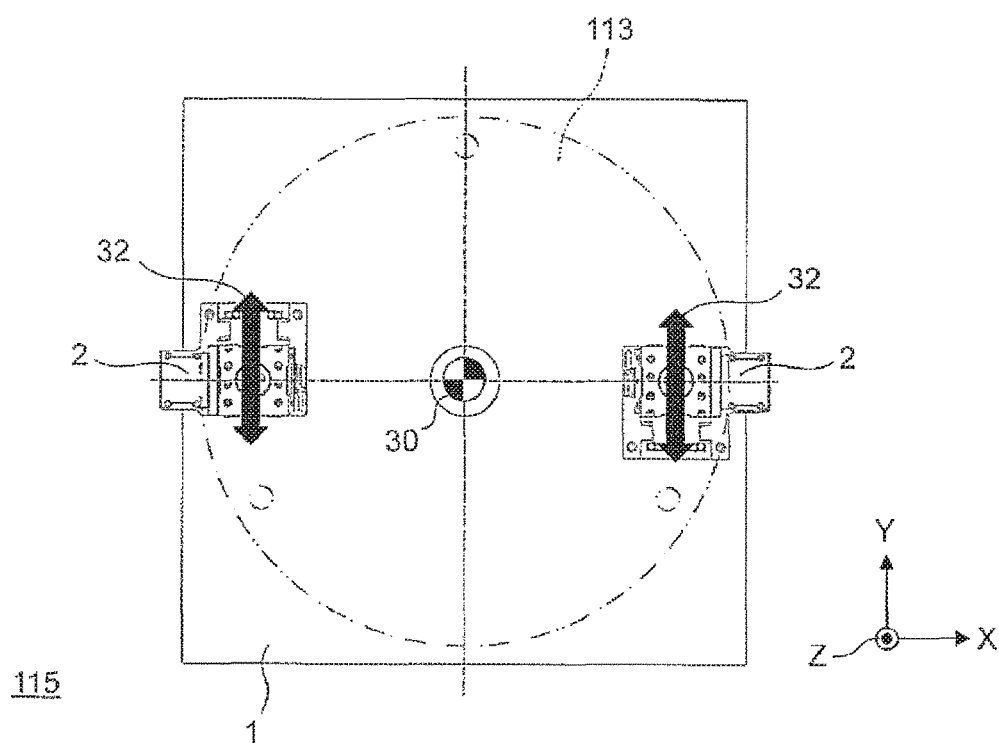

[FIG. 13C]
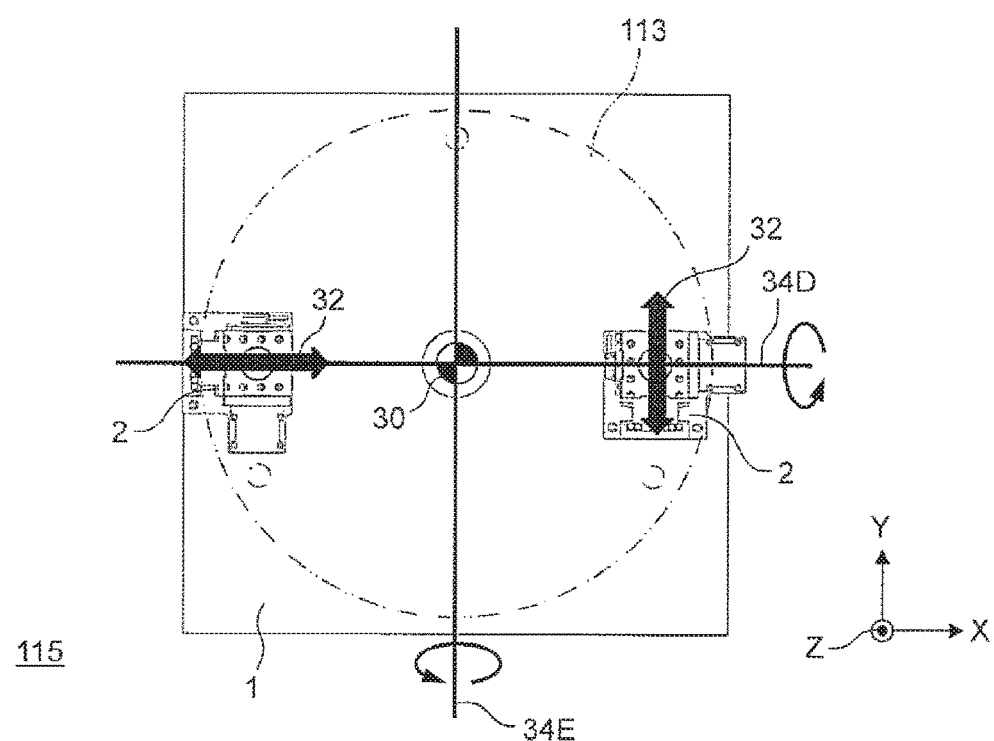

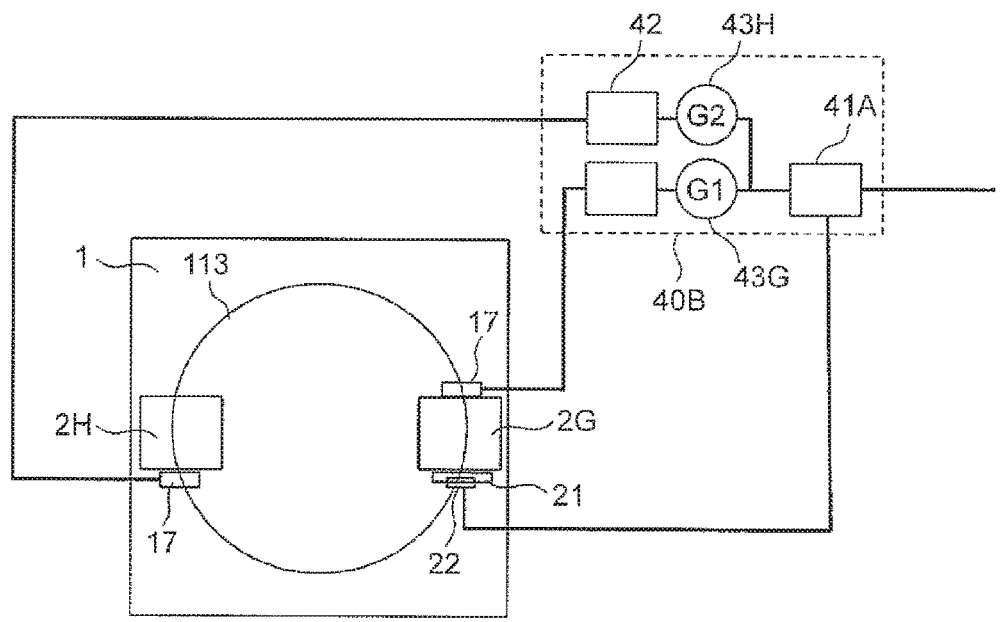
[FIG. 14]

[FIG. 15]
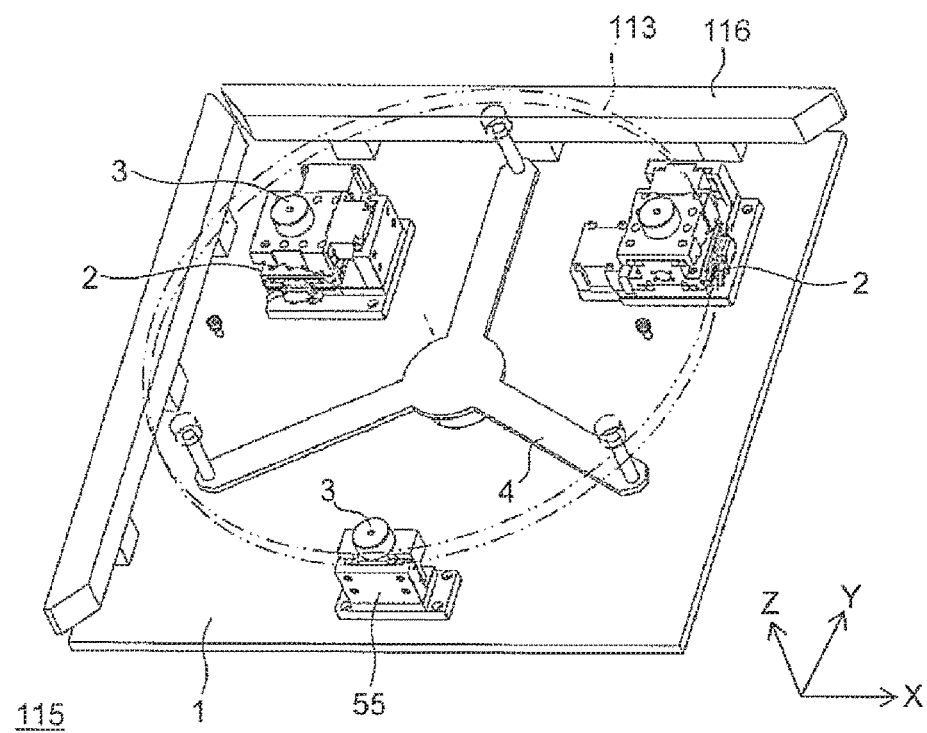

[FIG. 16]
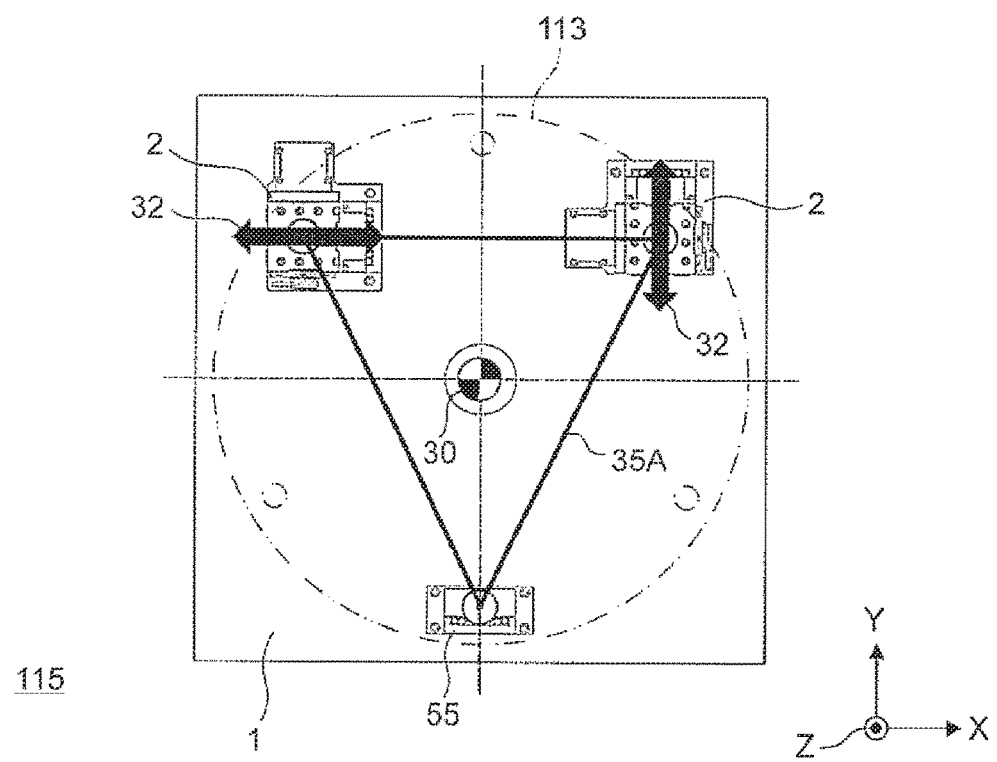

[FIG. 17A]
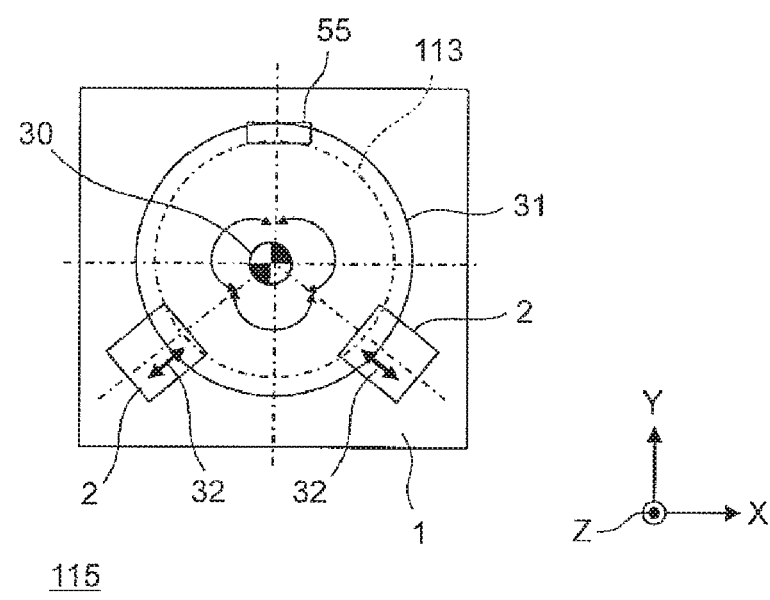

[FIG. 17B]
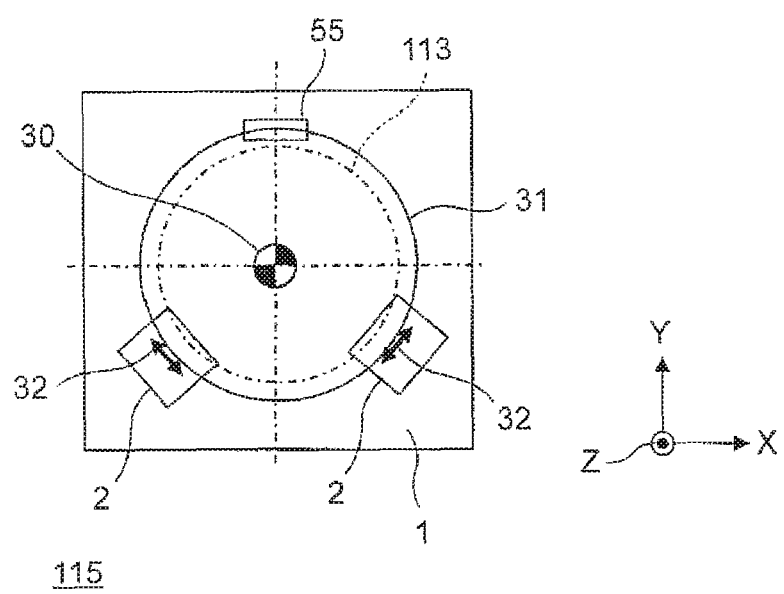

[FIG. 17C]
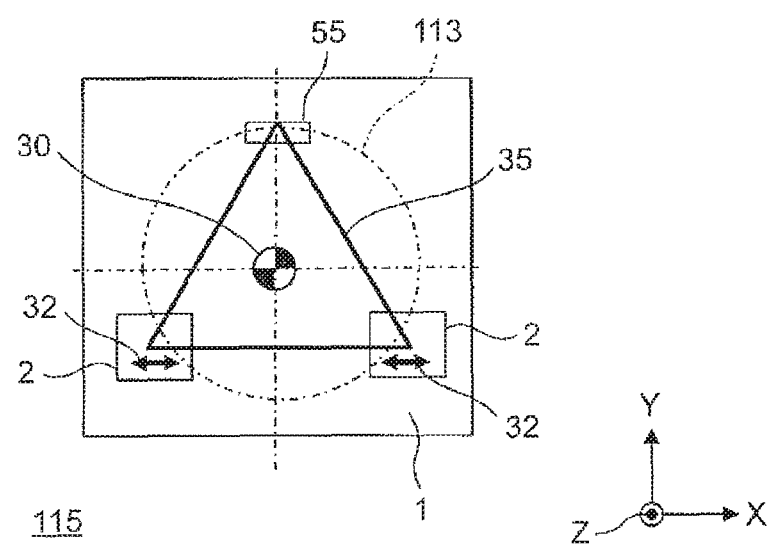

[FIG. 17D]
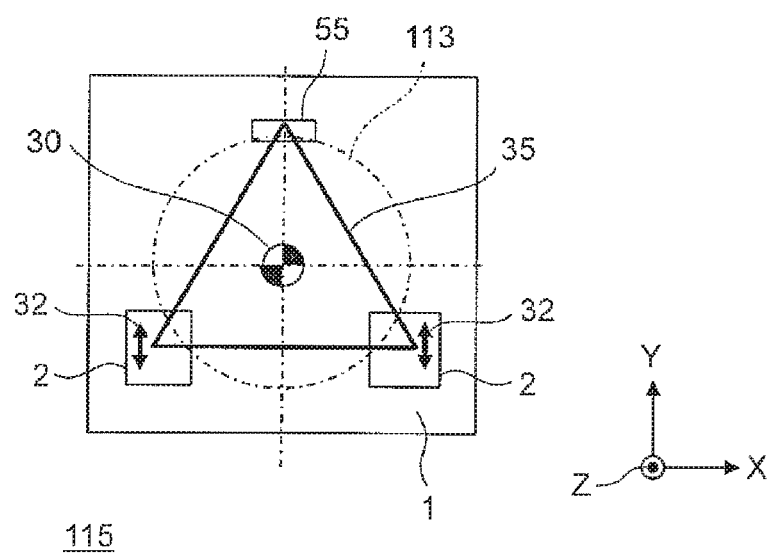

[FIG. 17E]
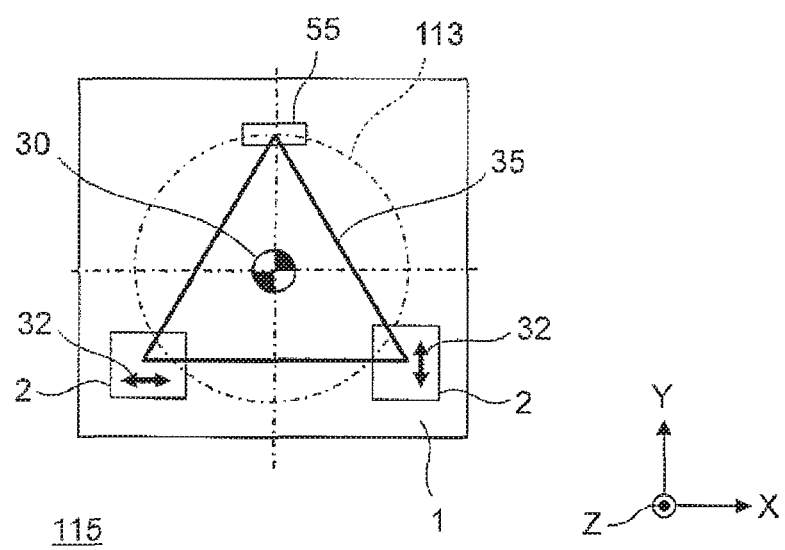

[FIG. 18]
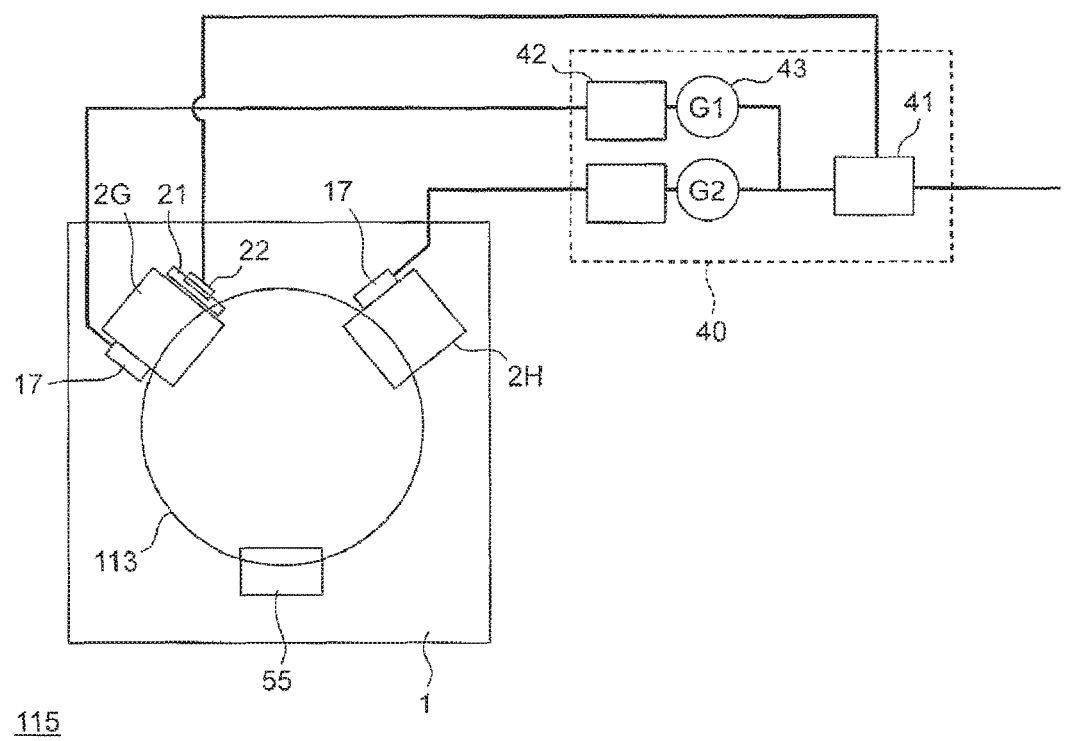

CHARGED PARTICLE BEAM APPARATUS AND SAMPLE ELEVATING APPARATUS

TECHNICAL FIELD

The present invention relates to a sample lifting and lowering device enabling vertical movement of a sample in a charged particle beam apparatus.

BACKGROUND ART

A charged particle beam apparatus typified by a scanning electron microscope (SEM) is used for inspection, analysis and observation of a semiconductor wafer and so on. In this kind of apparatus, a sample moving device (sample stage) with high accuracy and high rigidity is necessary from viewpoints of securing inspection accuracy, keeping/improving throughput and so on.

The sample moving device (sample stage) is configured by combining a planar movement (XY movement) device, a rotational movement (θ movement) device, a lifting and lowering (Z movement) device and the like in accordance with a purpose of the apparatus. In particular, the lifting and lowering (Z movement) device is required to keep posture accuracy and rigidity before and after the lifting/lowering in good condition without reducing operation performance of the planar movement (XY movement) device having high movement accuracy.

There is a device described in Patent Literature 1 as the lifting and lowering (Z movement) device. In Patent Literature 1, a Z stage (6) on which RXYT stages (2 to 5) are placed is described. The Z stage (6) includes two wedge-shaped slide members (13) formed into the same shape and arranged so that inclined surfaces face each other, a feed bolt (20) in which ball screw portions (24, 25) (configured by nut portions (21, 22) provided with spirals in opposite directions to each other and bolt portions (18, 19)) connected to the two wedge-type slide members (13) through a connecting member (31) are arranged in both ends and a stepping motor (23) driving the feed bolt (20) to rotate (FIG. 1 to FIG. 3). The Z stage (6) drives the RXYT stages (2 to 5) supported by the inclined surfaces of the two wedge-type slide members (13) vertically (Z direction) by moving the ball screw portions (24, 25) in opposite directions to each other by rotation of the feed bolt (20) ([0041] to [0045]).

CITATION LIST

Patent Literature

Patent Literature 1: JP-H10-3874

SUMMARY OF INVENTION

Technical Problem

In the charged particle beam apparatus for purposes of inspection, analysis and observation of the semiconductor wafer and so on, particularly in a critical dimension SEM for inspecting semiconductor device patterns formed on the semiconductor wafer, improvement in inspection accuracy and inspection speed (throughput) is required due to miniaturization of an inspection target and increase of a diameter in the semiconductor wafer occurring with improvement in semiconductor process technology.

Moreover, various types of inspections, analyses and observations are realized due to recent improvement in practical technology of a charged particle beam. For example, both the inspection and observation on the surface and in the vicinity of the surface of the semiconductor are possible by changing one optical condition in an electronic optical system. However, an optimum value of a focal length of an objective lens is changed when the optical condition is changed, and it becomes necessary to rearrange a distance from the objective lens to a sample surface that is called a working distance so as to correspond to the changed optical condition many cases.

There is a case where the focal length of the objective lens is shortened for improving resolution in the electronic optical system, as a result, the working distance may be extremely reduced. When the working distance is extremely reduced, it is difficult to replace the sample such as the semiconductor wafer as an observation target just below an electronic optical lens. In this case, countermeasures such as arrangement of a retraction space for replacing the sample such as the semiconductor wafer inside a work chamber are newly necessary. However, there occurs a new problem that the sample stage or the entire apparatus becomes large in size by newly providing the retraction space and so on.

In order to solve the above problems, it seems effective that a lifting and lowering mechanism for lifting and lowering the sample is mounted on the sample stage for performing planar movement. However, it is necessary to solve the following problems for mounting the lifting and lowering mechanism of the sample on the sample stage requiring realization of both highly accurate positioning and high-speed movement.

First, it is necessary to realize both weight reduction and rigidity in the lifting and lowering mechanism of the sample. As the diameter of the semiconductor wafer as the inspection target is increased, a sample fixing device such as an electrostatic chuck for supporting and fixing the sample is also increased in size. As a result, the mechanism of the sample lifting and lowering device for lifting and lowering the sample together with the sample fixing device is also increased in size. When the sample lifting and lowering device is increased in size while keeping sufficient rigidity as a structure body, the weight is also increased in many cases. However, the weight increase of the sample lifting and lowering device makes both the highly accurate positioning and high-speed movement of the sample stage difficult to realize. In particular, in the inspection apparatus such as the critical dimension SEM requiring a step-and-repeat operation, a large accelerator is added to the sample lifting and lowering device at the time of acceleration/deceleration. therefore, it is important to realize both the weight reduction and rigidity of the sample lifting and lowering device.

It is simultaneously necessary to reduce directional dependence in rigidity of the sample lifting and lowering device. In order to perform positioning accurately by performing point-to-point movement at high speed to an inspection point on the sample having a large area, it is important that not only the sample lifting and lowering device is light in weight and excellent in rigidity but also deviation in rigidity with respect to a movement direction is small.

Although various inventions and improvements have been hitherto proposed with respect to the above problems, any of them is not capable of sufficiently solving the above problems. For example, the size increase due to the increase in the diameter of the semiconductor wafer is inevitable in the mechanisms (ball screw portions (24, 25), the feed bolt (20)) used for synchronizing movements of the two wedge-shaped slide members (13) in the above Patent Literature 1, therefore, there are limitations to realize both weight reduction and high rigidity. Moreover, the two wedge-shaped slide members (13) are mechanically connected through the ball screw portions (24, 25) and the feed bolt (20) in the device described in Patent Literature 1, therefore, there are limitations in arrangement.

That is, a structure in which the two slide members are not individually arranged and the directional dependence in rigidity of the sample lifting and lowering device is fixed is just disclosed. Also, as described in a paragraph [0022] of the Patent Literature 1, explanation is made only for a reason why a both-hands type is applied, that is, to overcome disadvantages of a cantilever holding type, in which rigidity is low and vibration tends to occur. A direction in deceleration function (in other words, directional dependence of rigidity) is not considered.

Solution to Problem

In order to solve the above problems, the present invention adopts structures, for example, described in claims. More specifically, a charged particle beam apparatus according to the present invention includes a charged particle source generating a charged particle beam to be irradiated to a sample, a direction device detecting a signal generated from the sample by irradiation of the charged particle beam, a horizontal movement mechanism moving the sample to an observation position, a sample lifting and lowering device arranged above the horizontal movement mechanism, and a chamber including e charged particle source, the detection device, the horizontal movement mechanism and the sample lifting and lowering device and maintaining an internal space in a reduced pressure environment, which the sample lifting and lowering device includes first and second lifting and lowering mechanisms that lift and lower a sample stage to which tale sample is fixed, first and second driving devices that drive the first and second lifting and lowering mechanisms to be lifted and lowered individually, and a controller that synchronizes lifting/lowering operations of the first and second lifting and lowering mechanisms by the first and second driving devices first and second control signals, and the first lifting and lowering mechanism includes a first deceleration mechanism generating a first drive output obtained by decelerating a first drive input given from the first driving device in a direction different from a direction of the input, the second lifting and lowering mechanism includes a second deceleration mechanism generating a second drive output obtained by decelerating a second drive input given from the second driving device in a direction different from a direction of the input, and directions of the first and second drive inputs are different from each other as well as are not on the same straight line.

Advantageous Effects of Invention

According to the present invention, a sample lifting and lowering device capable of easily responding to increase of a diameter of a sample with light weight and high rigidity as well as with less directional dependence of rigidity can be realized. Problems, structures and advantages other than the above will be cleared by the following description of embodiments.

BRIEF DESCRIPTION OF DRAWINGS

FIG. 1 is a view showing the entire structure of an electronic microscope apparatus.

FIG. 2 is a view showing a structure example of a sample lifting and lowering device according to Embodiment 1.

FIG. 3 is an external structure view showing a lifting and lowering mechanism according to Embodiment 1.

FIG. 4 is an exploded perspective view showing the lifting and lowering mechanism according to Embodiment 1.

FIG. 5A is a view for explaining arrangement and driving directions of lifting and lowering mechanisms according to Embodiment 1.

FIG. 5B is a view for explaining arrangement and driving directions of lifting and lowering mechanisms according to Embodiment 1.

FIG. 6 is a view for explaining a technical advantage of the sample lifting and lowering device according to Embodiment 1.

FIG. 7 is a view for explaining a technical advantage of the sample lifting and lowering device according to Embodiment 1.

FIG. 8 is a view for explaining a control method of the sample lifting and lowering device according to Embodiment 1.

FIG. 9 is a view for explaining an external structure of a lifting and lowering mechanism according to Embodiment 2.

FIG. 10 is a view for explaining a control method of a sample lifting and lowering device according to Embodiment 3.

FIG. 11 is a view for explaining arrangement and driving directions of lifting and lowering mechanisms according to Embodiment 4.

FIG. 12 is a view showing a structure example of a sample lifting and lowering device according to Embodiment 5.

FIG. 13A is a view for explaining arrangement and driving directions of lifting and lowering mechanisms according to Embodiment 5.

FIG. 13B is a view for explaining arrangement and driving directions of lifting and lowering mechanisms according to Embodiment 5.

FIG. 13C is a view for explaining arrangement and driving directions of lifting and lowering mechanisms according to Embodiment 5.

FIG. 14 is a view for explaining a control method of the sample lifting and lowering device according to Embodiment 5.

FIG. 15 is a structure example of a sample lifting and lowering device according to Embodiment 6.

FIG. 16 is a view for explaining arrangement and driving directions of lifting and lowering mechanisms according to Embodiment 6.

FIG. 17A is a view for explaining arrangement and driving directions of lifting and lowering mechanisms according to Embodiment 6.

FIG. 17B is a view for explaining arrangement and driving directions of lifting and lowering mechanisms according to Embodiment 6.

FIG. 17C is a view for explaining arrangement and driving directions of lifting and lowering mechanisms according to Embodiment 6.

FIG. 17D is a view for explaining arrangement and driving directions of lifting and lowering mechanisms according to Embodiment 6.

FIG. 17E is a view for explaining arrangement and driving directions of lifting and lowering mechanisms according to Embodiment 6.

FIG. 18 is a view for explaining a control method of the sample lifting and lowering device according to Embodiment 6.

DESCRIPTION OF EMBODIMENTS

Hereinafter, embodiments of the present invention will be explained in detail with reference to the drawings. An electron microscope apparatus will be explained below, however, the same advantages can be obtained b apparatuses applying visible light, ultraviolet light, X-ray and the like (an inspection apparatus, an analyzer, an observation apparatus, a processing apparatus). Explanation will be made by an example in which a sample is a semiconductor wafer, however, it is obvious that the sample is not limited to the semiconductor wafer. In respective drawings used for explanation, portions with the same symbols are the same portion or have the same functions.

[Electronic Microscope Apparatus]

FIG. 1 shows the entire structure of an electronic microscope apparatus 100. The electronic microscope apparatus 100 includes an electronic optical device 101 and a sample chamber 102. In the present specification the electronic optical device 101 and the sample chamber 102 are collectively referred to also a "chamber". The inside of the electronic optical device 101 is kept in a vacuum environment by a vacuum evacuation device 103. An electron beam 105 emitted from an electron beam source 104 is adjusted in desired conditions by an electromagnetic lens 106, a deflection electrode 107 and so on, then, a sample 108 is irradiated with the electron beam 105. Due to the irradiation of the electron beam 105, secondary electrons 109 are generated from the surface of the sample 108. The secondary electrons 109 are detected by a secondary electron detector 110. A detection signal of the secondary electron detector 110 is given to a controller 111. The controller 111 acquires various information such as an image of a sample surface from the detection signal. The secondary electrons are detection targets in the present invention, however, reflection electrons or the like may be detection targets.

The inside of the sample chamber 102 is kept in the vacuum environment by a vacuum evacuation device 112. The sample 108 is placed and fixed on a sample fixing stage 113. The sample fixing stage 113 is placed on a sample lifting and lowering device 115, which is lifted and lowered (Z movement) by the sample lifting and lowering device 115. The sample lifting and lowering device 115 is placed on a XY-plane stage 114, which performs planar movement (XY movement) by the XY-plane stage 114.

In the vicinity of the sample fixing stage 113, a bar mirror 116 is arranged. Though the bar mirror 116 is arranged on the sample fixing stage 113 in FIG. 1, the bar mirror 116 may be arranged on the sample lifting and lowering device 115 as described later. A coordinate position of the XY-plane stage 114 is measured by measuring a position of the bar mirror 116 by using a laser length measuring gauge 117. The controller 111 performs drive control of a driving device 118 based on a result measured by the laser length measuring gauge 117 and moves the XY-plane stage 114 with extreme accuracy and at high speed. In FIG. 1, a cross-sectional structure of an X-Z plane is shown and a Y direction as a perpendicular direction on paper is not shown.

The controller 111 performs variable control of conditions including an acceleration voltage of the electron beam 105, the electromagnetic lens 106 and so on in accordance with information desired to be obtained from the sample 108. However, electronic optical conditions are changed when these conditions are changed, therefore, a work distance 120 as a distance between an objective lens 119 and the sample 108 is also changed. Variation of the work distance 120 is performed by moving the sample 108 in the vertical direction (Z-direction) by the sample lifting and lowering device 115.

As the electronic microscope apparatus 100 used in various fields has nanometer-level resolution, high rigidity is required also for the sample lifting and lowering device 115 on which the sample fixing stage 113 is placed. In particular, in the critical dimension SEM used for semiconductor inspection and the like, the diameter of the semiconductor wafer as an observation target is increasing, and high-speed movement of the XY-plane stage 114 performed for improving processing speed per a unit time, therefore, the sample lifting and lowering device 115 having high rigidity becomes necessary.

Embodiment 1

[Entire Structure]

FIG. 2 shows a structure example of the sample lifting and lowering device 115 used for the electronic microscope apparatus 100. In the embodiment, the sample fixing stage 113 corresponds to an electrostatic chuck or a mechanical chuck, and the not-shown sample 108 corresponds to the semiconductor wafer. The sample lifting and lowering device 115 is mounted on the not-shown XY-plane stage 114 through a base plate 1. However, the base plate 1 is not always necessary and a portion of the base plate 1 in the drawing may be the uppermost surface of the KY-plane stage 114.

The sample lifting and lowering device 115 includes plural (three in FIG. 1) lifting and lowering mechanisms 2 and supporting members 3 separately arranged on an upper surface of the base plate 1. Three supporting members 3 standing in Z-direction support the sample fixing stage 113 from a back surface side thereof. The support members 3 may have an actuator for tilting the stage. The support members 3 are devised so that influence of slight distortion or deformation generated in the sample fixing stage 113 is suppressed to the minimum by absorbing slight errors occurring when the lifting and lowing mechanisms 2 are synchronously-controlled and operated. When the supporting members 3 are formed of an insulating material, the sample fixing stage 113 and the sample 108 can be electrically insulated from other structure bodies. As a result, potentials of the sample 108 can be controlled and the sample can be matched with various observation conditions the electronic optical system.

On the base plate 1 shown in FIG. 2, the bar mirror 116 and a sample conveying mechanism 4 and so on are arranged. The bar mirror 116 is used for measuring the coordinate position of the not shown XY-plane stage 114 as described above. Three pins standing in the Z-direction are provided at tip end portions of the sample conveying mechanism 4 having a Y-shape. When the three pins are moved in the vertical direction along through holes provided in the sample fixing stage 113, the sample 108 can be placed on the sample fixing stage 113 or can be lifted from the sample fixing stage 113.

[Detailed Structure of Sample Lifting and Lowering Device 115]

The sample lifting and lowering device 115 used for the electronic microscope apparatus 100 requires positive operability and durability under the vacuum environment in addition to the above problems. It is known that the device is susceptible to friction and abrasion as well as susceptible to galling and fixing under the vacuum environment as compared with under an atmospheric environment. Moreover, reduction of a dusting amount is also required in semiconductor processes for improving yield. Furthermore, reduction of influence of the electronic beam, reduction of influence of heat generation in the driving device due to operation of the sample lifting and lowering device 115, avoidance of interference with mechanism elements such as the sample conveying mechanism 4 and so on are also required as problems peculiar semiconductor processes.

In order to solve the above problems, the lifting and lowering mechanism 2 having a structure shown in FIG. 3 and FIG. 4 is used for the sample lifting and lowering device 115. FIG. 3 is an external structure view of the lifting and lowering mechanism 2 and FIG. 4 is an exploded perspective view of the lifting and lowering mechanism 2. The lifting and lowering mechanism 2 includes a deceleration mechanism using a wedge type and a driving device that drives the deceleration mechanism. The wedge-type deceleration mechanism decelerates a drive input in a horizontal direction by the driving device and converts the input into a drive output in the vertical direction.

The lifting and lowering mechanism 2 includes a base plate 11, a horizontal movement mechanism 12, a middle wedge mechanism 13, an upper wedge mechanism 14 and a vertical guide mechanism 15. Guide mechanisms 16A functioning by being combined with each other are provided in the horizontal movement mechanism 12 and the middle wedge mechanism 13, and guide mechanisms 16B functioning by being combined with each other are provided in the middle wedge mechanism 13 and the upper wedge mechanism 14. Guide mechanisms 16C functioning by being combined with each other are provided in the upper wedge mechanism 14 and the vertical guide mechanism 15. As these guide mechanisms 16A to 16C, sliding guides using rolling guides (using cylindrical rollers, balls and the like) and a solid slide can be applied. In the present embodiment, the rolling guides using cylindrical rollers with a small friction coefficient and good efficiency are used for the guide mechanisms 16A to 16C.

A friction plate 18 for transmitting a driving force from a direct-acting ultrasonic motor 17 fixed to the base plate 11 is attached to the middle wedge mechanism 13. When the middle wedge mechanism 13 is moved in a direction of an arrow 19 by the direct-acting ultrasonic motor 17, the upper wedge mechanism 14 combined with the middle wedge mechanism 13 through inclined surfaces is guided by the vertical guide mechanism 15 and moves a direction of an arrow 20. That is, the upper wedge mechanism 14 is driven to be lifted and lowered. In an example in the drawing, the upper wedge mechanism 14 is lowered when the middle wedge mechanism 13 is moved in a direction away from the vertical guide mechanism 15, and whereas, the upper wedge mechanism 14 is lifted when the middle wedge mechanism 13 is moved in a direction closer to the vertical guide mechanism 15.

The direction of the arrow 19 indicating the movement direction of the middle mechanism 13 is a direction in which the driving force from the direct-acting ultrasonic motor 17 to the middle wedge mechanism 13 is inputted. The direction of the arrow 20 indicating the movement direction of the upper wedge mechanism 14 caused by the movement of the middle mechanism 13 is a direction which the driving force is outputted by the sample lifting and lowering device 115.

A linear scale head 22 for reading a movement amount of a linear scale 21 attached to the middle wedge mechanism 13 is stalled in the horizontal movement mechanism 12. In the specification, the linear scale 21 and the linear scale head 22 are collectively referred to also as a measurement device. A movement amount (vertical direction) of the upper wedge mechanism 14 can be found from a measurement value of the movement amount (horizontal direction) of the middle wedge mechanism 13. However, it is not always necessary to provide the linear scale 21 and the linear scale head 22 in all lifting and lowering mechanisms 2 provided in the sample lifting and lowering device 115, and they may be provided only in optional one or two lifting and lowering mechanisms 2 as described later.

[Advantages Obtained by Using Independent Wedge-Type Deceleration Mechanism]

The following advantages can be realized by adopting the lifting and lowering mechanism 2 having the structure shown in FIG. 3 and FIG. 4 as the sample lifting and lowering device 115. First, when the wedge-type deceleration mechanism is adopted, high rigidity can be obtained with respect to the lifting and lowering direction. In general, a mechanism having small reverse efficiency with respect to positive efficiency is advantageous for obtaining high rigidity for the movement direction, and the deceleration mechanism is one of mechanisms capable of reducing the reverse efficiency with respect to the positive efficiency.

There exists a deceleration mechanism using gears in deceleration mechanisms, however, when the deceleration mechanism using gears is adopted in the electronic microscope apparatus (under vacuum environment), galling cold fixing easily occur, which makes use of the apparatus difficult. On the other hand, in the wedge-type deceleration mechanism (FIG. 3, FIG. 4), rolling guides such as a cross-roller guide and a ball guide can be used for the guide mechanisms 16A to 16C. Accordingly, the friction coefficient can be reduced even under the vacuum environment and the deceleration mechanism can be configured while securing stable operation.

In the lifting and lowering mechanism 2, a ratio between an upper and lower movement amount of the upper wedge mechanism 14 and a horizontal movement amount of the middle wedge mechanism 13 determined by a wedge inclined angle 23 (FIG. 4) is a deceleration ratio. As larger the deceleration ratio is, the higher the rigidity in the lifting/lowering direction indicated by the arrow 20 can be taken. On the other hand, when the deceleration ratio is taken higher, a large movement amount is required in the horizontal direction (direction of the arrow 19), which is disadvantageous for reducing the size of the lifting and lowering mechanism 2 and for improving operation speed. Therefore, a good range of the deceleration ratio of the deceleration mechanism is 1:2 to 1:10. A better range of the deceleration ratio is approximately 1:2 to 1:4. In the present embodiment, the wedge inclined angle 23 is set to approximately 14.2 degrees, that is, the deceleration ratio is set to 1:4, thereby securing high rigidity and good lifting/lowering operation. Additionally, the rolling guides are used for the guide mechanisms 16A to 16C, thereby reducing generation of foreign matters due to lifting/lowering operation. Moreover, when the wedge-type deceleration mechanism is adopted, the magnitude of the driving force necessary for lifting/lowering operation can be reduced. Furthermore, a larger output proportional to the deceleration ratio can be obtained by adopting the deceleration mechanism.

In many charged particle beam apparatuses including the electronic microscope apparatus 100, mechanisms arranged close to the objective lens 119 are desirably formed of a non-magnetic material for reducing influence to the charged particle beam. In particular, the actuator as a drive source generates large-scale magnetic fields affecting the charged particle beam, therefore, non-magnetization is difficult. One of the few mechanisms in which actuators can be non-magnetized is a non-magnetic ultrasonic motor. A driving device applying friction contact typified by the ultrasonic motor has problems that it is difficult to bear a high load under the vacuum environment due to structural problems and thus a lifetime is short.

On the other hand, the lifting and lowering mechanism 2 according to the present embodiment can adopt the wedge-type deceleration mechanism, therefore, the load of the driving device can be reduced by the deceleration ratio. That is, the load of the ultrasonic motor can be reduced and the lifetime thereof can be improved. Furthermore, the load reduction of the ultrasonic motor also contributes to the reduction in heat generation amount of the ultrasonic motor itself, therefore, the heat generation amount caused by operation is reduced and influence to positioning accuracy or the like of the sample stage system caused by temperature can be reduced.

In the case where three independent lifting and lowering mechanisms 2 are arranged as in the present embodiment, the lifting and lowering mechanisms 2 can be directly arranged on the base plate 1. If the Z-stage (6) described in Patent Literature 1 is mounted on the XY-plane stage 114, it is inevitable that operation positions of the wedge-type slide members (13) are higher than the case of the present embodiment, which is not capable of being applied to an electronic microscope apparatus with a small working distance. Moreover, a barycenter position of driving members including the wedge-type slide members (13) is high, therefore, directional dependence of rigidity tends to be reduced. Accordingly, the Z-stage (6) described in Patent Literature 1 is not suitable to be mounted on the XY-plane stage 114.

[Advantages Seen from Arrangement Positions of Lifting and Lowering Mechanisms 2 and Directions of Drive Input]

An example of arrangement positions of the lifting and lowering mechanisms 2 and input directions of the driving force will be explained with reference to FIG. 5A and FIG. 5B. In the present embodiment, the independent three lifting and lowering mechanisms 2 are separately arranged on a circle 31 around a barycenter 30 of the sample fixing stage 113. The three and lowering mechanisms 2 are arranged at intervals of 120 degrees around the barycenter 30 in FIG. 5A and FIG. 5B, however, the intervals are not always necessary to be limited to 120 degrees.

The independent three lifting and lowering mechanisms 2 can be arranged so that movement directions 32 (hereinafter referred to also as "movement directions of the wedge-type deceleration mechanisms") of respective middle wedge mechanisms 13 are different from one another. That is, extended lines indicating the movement directions of the three middle wedge mechanisms 13 cross one another. It is desirable to control so that directions of the drive input with respect to the three lifting and lowering mechanisms 2 are not eccentric to the same direction for avoiding unevenness of rigidity.

FIG. 5A shows an example in which the movement directions 32 of the wedge deceleration mechanisms of lifting and lowering mechanisms 2 are directed to the barycenter 30 of the sample fixing stage 113, and FIG. 5B shows example in which the movement directions 32 are arranged in tangent line directions of the circle 31. In FIG. 5A, three extended lines 33 indicating the movement directions 32 of the deceleration mechanisms in the three lifting and lowering mechanisms 2 cross at the barycenter 30 of the sample fixing stage 113. In FIG. 5B, three extended lines 33 indicating the movement directions 32 of the deceleration mechanisms in three lifting and lowering mechanisms 2 cross at three points, and the barycenter 30 of the sample fixing stage 113 is placed inside triangle formed by these three cross points.

As shown in FIG. 5A and FIG. 5B, both weight reduction and increase of rigidity of the sample lifting and lowering device 115 can be realized by arranging three lifting and lowering mechanisms 2. FIG. 6 is a schematic view for explaining influence given by the size of the circle 31. Symbols R, r (r<R) in the drawing indicate radiuses of concentric circles (circles 31A and 31B) around the barycenter 30 of the sample fixing stage 113.

Here, rotational force added to the vicinity or an arbitrary axis 34 passing through the barycenter 30 of the sample fixing stage 113 is regarded as M. In this case, the rotational force M is represented by M=r×Fa when a load applied to lifting and lowering mechanisms 2A arranged on the circle 31A is regarded as Fa. Similarly, when a load applied to lifting and lowering mechanisms 21 arranged on the circle 31B is Fb, M=R×Fb. Accordingly, Fb=(r/R)×Fa. This relational expression indicates that the load Fb app led to each lifting and lowering mechanism 2 is smaller by a radius ratio when the three lifting and lowering mechanisms 2 are arranged on the circle 31B as compared with the case where the three lifting and lowering mechanisms 2 are arranged on the circle 31A.

That is, the larger the radius of the circle 31 in which the lifting and lowering mechanisms 2 are arranged is, the smaller the load to be applied to the lifting and lowering mechanisms 2 becomes. In other words, when the magnitude of the rotational force 14 to be taken is the same, the lifting and lowering mechanisms 2 can be reduced in size and weight by arranging the lifting and lowering mechanisms 2 so that the circle 31 becomes large. The reduction in size and weight of the lifting and lowering mechanisms 2 results in reduction in size and weight of the sample lifting and lowering a device 115.

In other words, even when the rotational force to be taken by the lifting and lowering mechanisms 2 is increased by the increase of the diameter of the sample 108 and the like, enhancement in the structure and size increase which are necessary for securing rigidity of the lifting and lowering mechanisms 2 can be suppressed to the minimum by arranging the lifting and lowering mechanisms 2 so that the radius of the circle 31 is increased. As a result, the lifting and lowering device 115 according to the present embodiment can realize both the reduction in weight and securement of high rigidity even when the sample 108 is increased in size.

Moreover, when the lifting and lowering mechanisms 2 are arranged as shown in FIG. 5A and FIG. 5B, directional dependence of rigidity in the sample lifting and lowering device 115 can be solved or reduced. The realization of rotational rigidity with less directional dependence by the sample lifting and lowering device 115 will be explained with reference to FIG. 7. In order to make explanation easier, a case where the sample fixing stage 113 (not shown) as a movement target is assumed to be a rigid body and three lifting and lowering mechanisms 2C are arranged on the circle 31B with the radius R around the barycenter 30 at equal angles (intervals of 120 degrees) will be explained. When a moment around an arbitrary axis 34C passing through the barycenter 30 is M, and angles made by the extended lines 33 of movement directions of the wedge-type deceleration mechanisms forming respective lifting and lowering mechanisms 2C and the axis 34C are respectively θ1, θ2 and θ3, conditions in which rotational forces around the axis 34C are balanced are represented by the following expression.

$$M \times \sin θ1 + M \times \sin θ2 = M \times \sin θ3 \quad \text{Expression (1)}$$

When rewriting the expression as θ1=θ by utilizing that respective lifting and lowering mechanisms 2C are arranged on the circle 31B at equal angles, θ2 and θ3 can be expressed as follow:

$$θ2 = π/3 - θ$$

$$θ3 = π/3 + θ$$

When the above expressions are substituted for the right side and the left side of Expression (1), Expression (1) can be deformed as the following expressions.

$$\sin θ + \sin(π/3 - θ) = \sin θ + \sin(π/3) \times \cos θ - \cos(π/3) \times \sin θ \quad \text{Left side of Expression (1)}$$

$$\sin(π/3 + θ) = \sin π/3 \times \cos θ + \cos π/3 \times \sin θ \quad \text{Right side of Expression (2)}$$

Here, $\sin(π/3) = \sqrt{3}/2$, $\cos(π/3) = 1/2$, therefore, the left side and the right side of the expression (1) are both $\sqrt{3}/2 \times \cos θ + 1/2 \times \sin θ$ concerning an arbitrary θ. That is, the expression (1) holds concerning an arbitrary θ, and the rotational rigidity around the arbitrary axis 34C passing through the barycenter 30 does not have directional dependence.

The case where the lifting and lowering mechanisms 2C are ideally arranged at equal angles on the circle 31B has been explained for making the explanation easy, the sample lifting and lowering device 115 having the rotational rigidity with less directional dependence can be realized in the present embodiment even when errors on mounting is considered. The above explanation has been made on the assumption that the sample lifting and lowering device 115 has the arrangement shown in FIG. 5A, however, the same advantages can be obtained also by the sample lifting and lowering device 115 having the arrangement shown in FIG. 5B.

[Advantages Seen from Operability and Durability Under Vacuum Environment]

When the lifting and lowering mechanisms 2 having the above structure are adopted as the sample lifting and lowering device 115, positive operation and durability can be realized even under the vacuum environment. As has been already explained, the lifting and lowering mechanisms 2 adopting the wedge-type deceleration mechanisms can reduce the load of the driving device by the deceleration ratio, therefore, the reduction in the load of the driving device and improvement of the lifetime can be realized.

Under the vacuum environment, heat generated along with operation of the driving device is not easily diffused to the vicinity, which may be a cause of local increase of temperature. The local increase of temperature affects performance such as the lifetime of the driving device itself as well as affects accuracy of the sample lifting and lowering device 115. For example, in a highly accurate stage used for the critical dimension SEM, there arise problems that thermal deformation is generated due to the locally generated heat and the accuracy of the stage system itself is reduced.

However, in the ample lifting and lowering device 115 according to the embodiment, the load applied to each of the lifting and lowering mechanisms 2 can be reduced by arranging the lifting and lowering mechanisms 2 separately on the XY-plane stage 114 as described above. Moreover, the load of the driving device is reduced, thereby largely reducing the heat generation amount of the driving device. Furthermore, as three lifting and lowering mechanisms 2 are separately arranged, heat sources are separated for the XY-plane stage 114, which is resultantly a condition which influence of thermal deformation is not easily received. Therefore, the sample lifting and lowering device 115 according to the present embodiment can secure positive operation and durability under the vacuum environment.

[Advantages Seen from Influence to Changed Particle Beam]

When the lifting and lowering mechanisms 2 having the above structure are adopted as the sample lifting and lowering device 115, the sample lifting and lowering device 115 with a small influence to the charged particle beam can be realized. As the magnetic material affects an orbit of the charged particle beam, it is desirable that the sample lifting and lowering device 115 is formed of a non-magnetic material.

However, it is difficult to form all members by using a non-magnetic or a material with no magnetism. In response to this, the lifting and lowering mechanisms 2 can be arranged outside an irradiation area of the electron beam 105 in the sample lifting and lowering device 115 according to the present embodiment, therefore, influence to the electron beam 105 can be reduced. At the same time, the unevenness of the magnetic material can be alleviated by separately arranging the lifting and lowering mechanisms 2, and the sample lifting and lowering device 115 with a small influence to the electron beam 105 can be realized.

[Advantages Seen from Avoidance of Interference with Other Components]

When the lifting and lowering mechanisms 2 having the above structure is adopted as the sample lifting and lowering device 115, physical interference between the sample lifting and lowering device 115 and the other mechanism elements (sample conveying mechanism 4 and the like) mounted on the XY-plane stage 114 (base plate 1) can be avoided. Moreover, various functional components such as the bar mirror 116 used for measuring the position of the XY-plane stage 114 and a sensor for detecting whether the sample 108 is mounted or not are mounted on the sample stage system in addition to the sample conveying mechanism 4. The sample conveying mechanism 4 is increased with the increase of the diameter of the semiconductor wafer and the interference with the sample lifting and lowering device 115 may become a problem on mounting particularly in apparatuses dealing with the semiconductor wafer as an observation target such as the critical dimension SEM. However, the interference with the sample conveying mechanism 115 is hardly occur when the sample lifting and lowering device 115 according to the embodiment is used as shown in FIG. 2, and the sample lifting and lowering device 115 can be realized without impairing functions necessary for the sample stage system.

[Concerning Synchronous Control of Sample Lifting and Lowering Device]

A control method of the sample lifting and lowering device 115 will be explained with reference to FIG. 8. The measurement device (the linear scale 21 and the linear scale head 22) used for measurement of the movement amount (lifting/lowering amount) is attached to each of the three lifting and lowering mechanisms 2. The direct-acting ultrasonic motors 17 and the linear scale heads 22 of respective lifting and lowering mechanisms 2 are all connected to a synchronous controller 40 through signal lines. The synchronous controller 40 is provided with a control device 41, motor drivers 42 and so on for driving the lifting and lowering mechanisms 2. The synchronous controller 40 may be realized as part of functions of the above described controller 111.

As in the present embodiment, operations of the three lifting and lowering mechanisms 2 that are independent from one another may generate machine differences due to resistance or friction or the guide mechanism 16A to 16C, transmission efficiency of the driving force from the direct-acting ultrasonic motors 17 and so on. Accordingly, the synchronous controller 40 according to the embodiment is provided with a function of individually setting control parameters 43 for absorbing these machine differences. The function of individually setting the control parameters 43 may be provided on a high-order system (for example, the controller 111) side as well as provided inside the synchronous controller 40. The control parameters 43 may be static values that are measured in advance as well as dynamic values that are connected during operation. The synchronous controller 40 is connected to the high-order system (for example, the controller 111), which can control the sample lifting and lowering device 115 based on an instruction from the high-order system as well as can perform control by itself.

Next, an example of lifting and lowering operations of the sample lifting and lowering device 115 will be explained from a viewpoint of synchronous control. When a lifting/lowering amount is given from the high-order system (for example, the controller 111) to the synchronous controller 40 as an instruction value, the control device 41 calculates drive amounts (movement amounts, movement speed and so on) with respect to respective lifting and lowering mechanisms 2 and performs instructions to the motor drivers 42. The respective motor drivers 42 calculate values obtained adding values of the control parameters 43 corresponding to the instruction values with respect to respective mechanisms, and drive corresponding direct-acting ultrasonic motors 17 based on the added values.

The movement amounts (horizontal direction) of the lifting and lowering mechanisms 2 caused by the driving of the direct-acting ultrasonic motors 17 are read by the linear scales 21 and the linear scale heads 22 and fed back to the control device 41. The control device 41 compares movement amounts of the three lifting and lowering mechanisms 2 and successively corrects the instruction value with respect to respective lifting and lowering mechanisms 2 so that the three lifting and lowering mechanisms 2 are synchronized (the lifting/lowering amounts of the three lifting and lowering mechanisms 2 are the same or heights of points of the three lifting and lowering mechanisms 2 are the same).

When the above control operations are adopted, the three lifting and lowering mechanisms 2 can be driven to be lifted or lowered in a state of be synchronized with high accuracy, and the lifting and lowering operations with good reproducibility can be realized without giving the load to the sample 108 mounted on the sample fixing stage 113. It is obvious that the same advantages can be obtained when using at least the system in which feedback control is performed so that the lifting/lowering amounts are the same based on respective movement amounts of the three lifting and lowering mechanisms 2.

SUMMARY

As explained above, the sample lifting and lowering device 115 according to the embodiment arranges the three lifting and lowering mechanisms 2 which are independent devices on the base plate 1 separately and synchronizes these operations by control signals. Accordingly, the device can easily correspond to the increase of the diameter of the sample 108. Even when the sample 108 is increased in diameter, the sample lifting and lowering device 115 can maintain high rigidity while being light in weight, therefore, positioning with high accuracy and high-speed movement performance of the XY-plane stage 114 are not impaired. Moreover, the sample lifting and lowering device 115 according to the embodiment can realize rotational rigidity with less directional dependence, therefore, the present invention is advantageous for the highly accurate positioning and high-speed movement by the XY-plane stage 114.

As the lifting and lowering mechanism 2 formed by the wedge-type deceleration mechanism is adopted in the sample lifting and lowering device 115 according to the embodiment, the load of the driving device can be reduced the deceleration ratio, therefore, positive operation and durability under the vacuum environment can be realized. Furthermore, the three lifting and lowering mechanisms 2 as independent devices can be arranged separately, therefore, influence to the electron beam 105 can be reduced. As the lifting and lowering mechanisms 2 as independent devices can be arranged separately, interference with other mechanism elements mounted on the XY-plane stage 114 (base plate 1) can be avoided easily.

Embodiment 2

Subsequently, another embodiment of the sample lifting and lowering device 115 will be explained. The structure of the electron microscope apparatus 100 (FIG. 1) on which the sample lifting and lowering device 115 is mounted is the same as Embodiment 1. FIG. 9 shows a structure example of the lifting and lowering mechanism 2 used for the sample lifting and lowering device 115 according to the present embodiment. The lifting and lowering mechanism 2 according to the embodiment differs from that of Embodiment 1 in a point that a rotary ultrasonic motor 51 is used instead of the direct-acting ultrasonic motor 17.

In a case of the embodiment, a rotation shaft of the rotary ultrasonic motor 51 is connected to a root side of a screw shaft 53 forming a ball screw through a coupling 52. A tip side of the screw shaft 53 is connected to the middle wedge mechanism 13 through a nut (not shown) provided inside the middle wedge mechanism 13. The screw shaft 53 is held by a bearing (not shown) installed inside a bearing house 54, which enables smooth rotation. The screw shaft 53 and the bearing house 54 (including the not-shown bearing) configure the ball screw. According to the structure shown in FIG. 9, a rotational force generated in the rotary ultrasonic motor 51 is converted into a drive input of the middle wedge mechanism 13 in the horizontal direction 19 through the screw shaft 53. The movement of the middle wedge mechanism 13 in the horizontal direction is converted into the lifting/lowering operation of the upper wedge mechanism 14 in the same manner as Embodiment 1.

The lifting and lowering mechanism 2 according to the embodiment also uses the wedge-type deceleration mechanism. However, in the same manner as Embodiment 1, it is necessary that the middle wedge mechanism 13 moves in the horizontal direction 19 by a magnification given by the deceleration ratio with respect to the lifting/lowering amount. It is generally difficult to increase lifting/lowering speed in this structure, though the high rigidity can be obtained. On the other hand, when the structure of the embodiment is adopted, movement speed of the middle wedge mechanism 13 can be selected by selecting a lead (a movement amount in an axial direction when a screw turns once) of the screw shaft 53.

The reason of the above is that the movement speed of the middle wedge mechanism 13 is determined by a product of the rotation speed of the rotary ultrasonic motor 51 and the lead of the screw shaft 53. For example, the rotation speed of the rotary ultrasonic motor 51 is fixed, the movement speed obtained when the lead of the screw shaft 53 is "2" is twice as fast as the movement speed obtained when the lead of the screw shaft 53 is "1".

The rotary ultrasonic motor 51 can easily arrange a friction plate for converging ultrasonic waves into the driving force inside a casing, therefore, generation of foreign matters can be also reduced. The rotary ultrasonic motor 51 can easily obtain advantages in costs as the control device can be easily configured.

Embodiment 3

Another control method of the sample lifting and lowering device 15 will be explained in the present embodiment. FIG. 10 shows a control method of the sample lifting and lowering device 115 according to the embodiment. The sample lifting and lowering device 115 differs from the above embodiments in a point that the measurement device (the linear scale 21 and the linear scale head 22) for reading the movement amount (lifting/lowering amount) is mounted only on a lifting and lowering mechanism 2D. Accordingly, only a measurement value of the linear scale head 22 mounted on the lifting and lowering mechanism 2D is fed back to synchronous controller 40A. Naturally, the measurement device for reading the movement amount (lifting/lowering amount) is not installed in lifting and lowering mechanisms 2E and 2F, which differs from the above embodiments.

The direct-acting ultrasonic motors 17 of three lifting and lowering mechanisms 2D, 2E and 2F are connected to the synchronous controller 40A in the same manner as the above Embodiment 2. All operations of the three direct-acting ultrasonic motors 17 are controlled based on control signals given from the synchronous controller 40A. The basic structure of the synchronous controller 40A is the same as the above synchronous controller 40 (FIG. 8) That is, the synchronous controller 40A is configured by a control device 41A, the motor drivers 42 and so on. The synchronous controller 40A is also provided with control parameters 43D, 43E and 43F for absorbing machine differences of the lifting and lowering mechanisms 2D, 2E and 2F.

The control parameters 43D, 43E and 43F may be static values measured in advance as well as dynamic values corrected during operation. The control device 41A is connected to a not-shown high-order system, and the sample lifting and lowering device 115 can be controlled based on an instruction from the high-order system as well as controlled by itself.

Next, an example of controlling lifting and lowering operations of the sample lifting and lowering device 115 according to the embodiment will be explained. When a lifting/lowering amount is given from the high-order system (for example, the controller 111) to the synchronous controller 40A, the control device 41A calculates instruction values (movement amounts, movement speed and the like) with respect to the lifting and lowering mechanisms 2D, 2E and 2F and performs instructions to corresponding motor drivers 42, respectively. Three respective motor drivers 42 calculate values obtained by adding values of the control parameters 43D to the instruction values, and drive corresponding direct-acting ultrasonic motors 17 based on the calculated added values.

In the embodiment, the movement amount (lifting/lowering amount) only for the lifting and lowering mechanism 2D is measured by the measurement device (the linear scale and the linear scale head 22) and fed back to the control device 41A. The control device 41 calculates instruction values with respect to respective lifting and lowering mechanisms 2E and 2F so that the lifting/lowering amounts of the lifting and lowering mechanisms 2E and 2F are synchronized with (becomes the same as) the lifting/lowering amount of the lifting and lowering mechanism 2D by using the movement amount (lifting/lowering amount) of the lifting and lowering mechanism 2D as a reference.

As the function of reading the moving amount lifting/lowering amount) (the linear scale 21 and the linear scale head 22) is not provided in the lifting and lowering mechanisms 2E and 2F in the case of the embodiment, the control device 41A performs open control, therefore, is difficult to synchronize the lifting/lowering amounts of the lifting and lowering mechanisms 2E and 2F with the lifting/lowering amount of the lifting and lowering mechanism 2D.

In response to the above, respective movement amounts (lifting/lowering amounts) of the lifting and lowering mechanisms 2E and 2F are measured in advance by using the movement amount (lifting/lowering amount) obtained when the lifting and lowering mechanism 2D is control led to be driven in particular driving conditions as a reference value, and the control parameters 43E and 43F are determined so that the lifting/lowering amount of the lifting and lowering mechanism 2D is synchronized with the lifting lowering amounts of the lifting and lowering mechanisms 2E and 2F. When operation characteristics of the lifting and lowering mechanism 2, are affected by friction and so on of the guide mechanisms 16A to 16C and become in a state not suitable as the reference lifting/lowering amount, a function of correcting the control parameters 43D so that flatter operation characteristics are measured is installed.

As described above, even when the movement amounts (lifting/lowering amounts) concerning all the three lifting and lowering mechanisms 2D to 2F are not read, synchronized driving with respect to other lifting and lowering mechanisms (the lifting and lowering mechanisms 2E and 2F in the embodiment) can be realized by using the movement amount (lifting/lowering amount) measured from one lifting and lowering mechanism (the lifting and lowering mechanism 2D in the embodiment) under specific operation conditions as a reference. Accordingly, the sample lifting and lowering device 115 can realize lifting and lowering operations with high accuracy in the same manner as the above embodiments.

Actually, operation patterns of the sample lifting and lowering device 115 can be divided into approximately several patterns such as observation processes and replacement operation of the sample in many electronic microscope apparatuses 100. Accordingly, the measurement device (the linear scale 21 and the linear scale head 22) for reading the moving amount lifting/lowering amount) is mounted only on one lifting and lowering mechanism 2 as explained in the embodiment, thereby realizing the sample lifting and lowering device 115 at lower costs with a simple structure.

Embodiment 4

FIG. 11 shows another structure example of the sample lifting and lowering device 115. In the embodiment, the lifting and lowering mechanisms 2 are arranged at apex positions of a triangle 35 including the barycenter 30 of the sample fixing stage 113, and at least one of the moving directions 32 of deceleration mechanisms of the three lifting and lowering mechanisms 2 differs from (crosses) the movement directions 32 of the deceleration mechanisms of other lifting and lowering mechanisms 2. All the lifting and lowering mechanisms 2 have the wedge-type deceleration mechanisms shown in FIG. 3 and FIG. 4.

In FIG. 11, arrangement is made so that the movement direction 32 of the deceleration mechanism of one lift lowering mechanism 2 is orthogonal to the movement directions 32 of the deceleration mechanisms of the other two lifting and lowering mechanisms 2. When the barycenter 30 is positioned inside the triangle 35, the sample fixing stage 113 is supported stably by a plane prescribed by the three lifting and lowering mechanisms 2.

The arrangement is the most stable in a case where a barycenter of the triangle 35 corresponds to the barycenter 30 of the sample fixing stage 113. When the triangle 35 is an equilateral triangle, arrangement conditions are the same as those explained in Embodiment 1. Moreover, when arrangement is made so that the movement directions 32 of the deceleration mechanisms of the three lifting and lowering mechanisms 2 are orthogonal to one another, the sample lifting and lowering device 115 having rotational rigidity with less directional dependence can be realized even when the position the barycenter 30 is not ideal.

As descried above, various mechanism such as the sample conveying mechanism 4 are mounted on the XY-plane stage 114 in many cases. Accordingly, it is practically important to avoid interference between the sample lifting and lowering device 115 these mechanisms. The lifting and lowering mechanisms 2 forming the sample lifting and lowering device 115 are not always arranged at ideal places balanced dynamically due to constraints on the structure of the XY-plane stage 114. However, the same advantages as those of the above respective embodiments be obtained by arranging the lifting and lowering mechanisms 2 so that the movement directions 32 of the deceleration mechanisms are not aligned as in the embodiment even when such constraint conditions exist.

Embodiment 5

Another structure example of the sample lifting and lowering device 115 will be explained with reference to FIG. 12. In the above embodiments, the sample lifting and lowering device 115 is configured by three lifting and lowering mechanisms 2. In the present embodiment, a case where sample lifting and lowering device 115 is configured by two lifting and lowering mechanisms 2 will be explained. In the case of the embodiment, the barycenter 30 of the sample fixing stage 113 is arranged on a straight line connecting the two lifting and lowering mechanisms 2. Ideally, the barycenter 30 of the sample fixing stage 113 is arranged at middle point of a segment in which endpoints correspond to arrangement positions of the two lifting and lowering mechanisms 2.

The reason the above is that a rotational force proportional to a distance between the straight line and the barycenter 30 (the minimum value of a length from the barycenter 30 and the straight line) is generated when the barycenter 30 of the sample fixing stage 113 is deviated from the straight line connecting the two lifting and lowering mechanisms 2, therefore, the rigidity as the sample lifting and lowering device 115 tends to be impaired. This is also because, when the sample fixing stage 113 can ignore deformation by own weight, the smaller the distance from the barycenter 30 is, the lower the rigidity taken by the lifting and lowering mechanisms 2 becomes. Therefore, the structure of the embodiment is effective to realization of both the weight reduction and securement of rigidity in the sample lifting and lowering device 115.

Arrangement examples of the two lifting and lowering mechanisms 2 according to the embodiment will be explained with reference to FIG. 13A to FIG. 13C. FIG. 13A shows an example in which arrangement is made so that the movement directions 32 of the deceleration mechanisms of the lifting and lowering mechanisms 2 face each other. For example, when the sample fixing stage 113 is lowered, the middle wedge mechanisms 13 of the two lifting and lowering mechanisms 2 both move toward the barycenter 30 (move in opposite directions). On the other hand, when the sample fixing stage 113 is lifted, the middle wedge mechanisms 13 of the two lifting and lowering mechanisms 2 both move in directions away from the barycenter 30 (move in opposite directions).

When the two lifting and lowering mechanisms 2 are controlled to be driven in synchronized with each other, vibrating forces generated with lifting/lowering operations cancel each other out by arranging the two lifting and lowering mechanisms 2 so that the movement directions of the deceleration mechanisms thereof face each other, therefore, the sample lifting and lowering device 115 which hardly vibrates can be realized.

The lifting and lowering mechanism 2 according to the embodiment is a mechanism performing lifting and lowering operations by converting a horizontal movement of the middle wedge mechanism 13 into a movement in the vertical direction, therefore, an acceleration occurs in the movement direction 32 the deceleration mechanism when the middle wedge mechanism 113 is moved for a lifting/lowering operation. The acceleration may become a vibration source of the sample lifting and lowering device 115, which may cause problems such as disturbance of an image in a case where observation is necessary even during operation of the sample lifting and lowering device 115 or other cases. However, when adopting the arrangement shown in FIG. 13A, the vibrating forces cancel each other out even in the case where the two lifting and lowering mechanisms are driven in synchronization with other, and operation with less vibration can be realized.

FIG. 13B shows an example in which arrangement is made so that the movement directions 32 of the deceleration mechanisms of the two lifting and lowering mechanisms 2 are opposite and parallel to each other. For example, when the sample fixing stage 113 is lowered, the middle wedge mechanism 13 of the left-side lifting and lowering mechanism 2 is moved in the positive direction of Y-axis and the middle wedge mechanism 13 of the right-side lifting and lowering mechanism 2 is moved in the negative direction of Y-axis. When the sample fixing stage 113 lifted, the middle wedge mechanism 13 of the left-side lifting and lowering mechanism 2 is moved in the negative direction of Y-axis, and on the other hand, the middle wedge mechanism 13 of the right-side lifting and lowering mechanism 2 is moved in the positive direction of Y-axis. Also in this case, the movement directions 32 of the deceleration mechanisms face each other, therefore, an effect of reducing vibration with the lifting/lowering operation can be obtained.

The following advantages can be also expected in the case of the arrangement example shown in FIG. 13B. As described above, the deceleration ratio of the deceleration mechanism used in the lifting and lowering mechanism 2 is determined by a ratio between the movement amount of the middle wedge mechanism 13 and the lifting lowering amount of the upper wedge mechanism 14. As the deceleration ratio is taken higher, the rigidity in the lifting/lowering direction can be increased. On the other hand, when the deceleration ratio is taken higher, the movement amount of the middle wedge mechanism 13 is increased, as a result, a long distance is necessary as the movement direction of the deceleration mechanism in the lifting and lowering mechanism 2. However, a space where the lifting and lowering mechanisms 2 can be arranged is limited in the arrangement example shown in FIG. 13A. On the other hand, the arrangement example shown in FIG. 13B, there is no constraint as in FIG. 13A, therefore, it is possible to use the setting space effectively, and a more compact sample lifting and lowering device 115 can be realized.

FIG. 13C shows an example where arrangement is made so that the movement direction 32 of the deceleration mechanisms of the lifting and lower mechanisms 2 are orthogonal to each other. As the lifting and lowering mechanism 2 uses the wedge-type deceleration mechanism, the lifting and lowering mechanism basically has high rigidity, but strictly, the rigidity differs in the movement direction of the middle wedge mechanism 13 and in the direction orthogonal to the movement direction. However, a sum of rotational rigidity, for example, around an axis 34D and an axis 34E passing through the barycenter 30 of the sample fixing stage 113 is the same as the two lift and lowering mechanisms 2 are orthogonal to each other by adopting the arrangement shown in FIG. 13C, and the sample lifting and lowering device 115 with small directional dependence of rigidity can be realized.

A control method of the sample lifting and lowering device 115 configured by two lifting and lowering mechanisms 2 will explained with reference to FIG. 14. In the sample lifting and lowering device 115 according the embodiment, a case where the measurement device (the linear scale 21 and the linear scale head 22) for reading the movement amount (lifting/lowering amount) is mounted only on a lifting and lowering mechanism 2G, and the same device is not mounted on a lifting and lowering mechanism 2H will be explained. Accordingly, a synchronous controller 40B is connected to the direct-acting ultrasonic motor 17 of the lifting and lowering mechanism 2G, the direct-acting ultrasonic motor 17 of the lifting and lowering mechanism 2H and the linear scale head 22 of the lifting and lowering mechanism 2G through signal lines.

The synchronous controller 40B is configured by the control device 41A, the motor drivers 42 and so on in the same manner as the above embodiment. The synchronous controller 40B is also provided with a function of installing control parameters 43G and 43H for absorbing a machine difference between the lifting and lowering mechanisms 2G and 2H. The control parameters 43G and 43H may also be static values measured in advance as well as dynamic values corrected during operation in the same manner as in embodiments described above. The control device 41A is connected to a high-order system (for example, the controller 111) and controls the sample lifting and lowering device 115 based on an instruction from the higher-order system. The control device 41A may also control lifting and lowering operations of the sample lifting and lowering device 115 by itself.

The synchronous controller 40B according to the embodiment also controls the lifting and lowering mechanism 2G to be driven in specific operation conditions in the same manner as in the case of Embodiment 3, and controls a lifting/lowering amount of the other lifting and lowering mechanism 2H by using a movement amount (lifting/lowering amount) read from the lifting and lowering mechanism 2G as a reference value. Accordingly, the lifting/lowering amount of the lifting and lowering mechanism 2G can be synchronized with the lifting/lowering amount of the lifting and lowering mechanism 2H. That is, the sample lifting and lowering device 115 capable of lifting and lowering the lifting and lowering mechanisms 2G and 2H with high accuracy can be realized. Also in the embodiment, the measurement device (the linear scale 21 and the linear scale head 22) for reading the movement amount (lifting/lowering amount) may be mounted on both of the lifting and lowering mechanisms 2G and 2H. In that case, control can be performed in the same manner as the control method explained in Embodiment 1.

Embodiment 6

Another structure example of the sample lifting and lowering device 115 is shown in FIG. 15. In the embodiment, the sample lifting and lowering device 115 in which a vertical guide mechanism 55 not having a driving device and two lifting and lowering devices 2 are combined will be explained. The vertical guide mechanism 55 is a member that guides the sample fixing stage 113 in a vertical direction (regulating movement in the horizontal direction). For example, the vertical guide mechanism 55 has the same structure as the vertical guide mechanism 15. The vertical guide mechanism 55 may have a spring structure so as to follow lifting/lowering of the sample fixing stage 113 by the two lifting and lowering mechanisms 2. In this case, a support force by the spring is set so as to balance with a load of, for example, the sample fixing stage 113 and the sample 108.

FIG. 16 shows a relation between arrangement positions of the two lifting and lowering mechanisms 2 and the vertical guide mechanism and drive input directions according to the embodiment. In the embodiment, the barycenter 30 of the sample fixing stage 113 is positioned inside a triangle 35A having apexes corresponding to the two lifting and lowering mechanisms 2 and the vertical guide mechanism 55, and the movement directions 32 of deceleration mechanisms of the two lifting and lowering mechanisms 2 are orthogonal to each other.

Also in this case, various combinations may be considered between arrangement positions of the two lifting and lowering mechanisms 2 and the vertical guide mechanism 55 and the movement directions 32 of the deceleration mechanisms forming the two lifting and lowering mechanisms 2 in the same manner as the above embodiments. FIG. 17A to FIG. 17E show examples of various combinations. Advantages approximately equivalent to the above embodiments can be obtained by adopting any of the combinations. In FIG. 17A to FIG. 17E, the two lifting and lowering mechanisms 2 and the vertical guide mechanism 55 are arranged on a same circle around the barycenter 30 of the sample fixing stage 113 and apex positions of a triangle including the barycenter 30 of the sample fixing stage 113.

FIG. 17A shows an arrangement example in which the movement directions 32 of the deceleration mechanisms forming the two lifting and lowering mechanisms 2 cross at the barycenter 30 of the sample fixing stage 113. FIG. 17B shows an arrangement example in which the movement directions 32 of the deceleration mechanisms forming the two lifting and lowering mechanisms 2 are in tangent line directions of a same circle around the barycenter 30 of the sample fixing stage 113. These arrangement example can reduce directional dependence of rotational rigidity as explained in Embodiment 1.

FIG. 17C is an arrangement example in which the movement directions 32 of the deceleration mechanisms forming the two lifting and lowering mechanisms 2 face each other. FIG. 17D is an arrangement example in which the movement directions 32 of the deceleration mechanisms forming the two lifting and lowering mechanisms 2 are opposite and parallel to each other. FIG. 17E is an arrangement example in which the movement directions 32 of the deceleration mechanisms forming the two lifting and lowering mechanisms 2 are orthogonal to each other.

In any of these cases, it is not necessary that the two lifting and lowering mechanisms 2 are positioned on a straight line passing the barycenter 30 of the sample fixing stage 113. When the arrangements shown in FIG. 17A to FIG. 17E are adopted, vibrating forces can cancel each other out as explained in Embodiment 5, therefore, the sample lifting and lowering device 115 with less vibration and the sample lifting and lowering device 115 with less directional dependence of rigidity can be realized.

FIG. 18 shows a control method of the sample lifting and lowering device 115 according to the embodiment. Also in the case of the embodiment, the measurement device (the linear scale 21 and the linear scale head 22) for reading the movement amount (lifting/lowering amount) is provided only in one lifting and lowering mechanism 2G in the two lifting and lowering mechanism 2G and 2H. Therefore, the function of reading the movement amount (lifting/lowering amount) is not provided in the lifting and lowering mechanism 2H and the vertical guide mechanism 55. The linear scale 21 and the linear scale head 22 may be provided in at least one of the two lifting and lowering mechanisms 2G, 2H and the vertical guide mechanism 55, or may be provided in all the two lifting and lowering mechanisms 2G, 2H and the vertical guide mechanism 55.

When the linear scale 21 and the linear scale head 22 are provided only in one of the two lifting and lowering mechanisms 2G, 2H and the vertical guide mechanism 55, the synchronous controller 40 performs control so as to synchronize movement amounts (lifting/lowering amounts) or other mechanisms (that is, another lifting and lowering mechanism or two lifting and lowering mechanisms) by using a measurement value of the movement amount lifting/lowering amount) by the linear scale head 22 as a reference as explained in Embodiment 3. Accordingly, possible to realize lifting/lowering operations with good reproducibility without giving a load to the sample 108 mounted on the sample fixing stage 113.

When the linear scale 21 and the linear scale head 22 are provided in all the two lifting and lowering mechanisms 2G, 2H, it is possible to realize lifting/lowering operations with good reproducibility without giving a load to the sample 108 mounted on the sample fixing stage 113 by adopting the synchronous control method explained in Embodiment 1. Accordingly, the sample lifting and lowering device 115 with high rigidity and high accuracy can be realized at lower costs.

Other Embodiments

The present invention is not limited to the above-described embodiments and includes various modification examples. For example, explanation has been made on the assumption that the wedge-type lifting and lowering mechanism 2 shown in FIG. 3 and FIG. 4 is used as the lifting and lowering mechanism in the above embodiments. This is because high rigidity can be expected in the wedge-type lifting and lowering mechanism 2. However, the present invention can be realized also by lifting and lowering mechanisms adopting deceleration mechanisms other than the wedge-type deceleration mechanism. For example, a helicoid-screw type (a type using a cylindrical cam mechanism) lifting and lowering mechanism may be used. In the case of the helicoid-screw type lifting and lowering mechanism, an input direction of the driving force is rotation about the rotation shaft, an output direction of the lifting and lowering mechanism is a vertical direction. The deceleration ratio can be adjusted in accordance with an inclined angle of a guide groove formed in a spiral shape. Rotation directions of drive inputs with respect to plural lifting and lowering mechanisms 2 are not aligned, thereby reducing the directional dependence of rigidity.

The movement amount (horizontal direction) of the middle wedge mechanism 13 is measured by the linear scale 21 and the rear scale head 22 in the above embodiments, however, a movement amount (vertical direction) of the upper wedge mechanism 14 may be measured.

Also in the above embodiments, it is not necessary that the sample lifting and lowering device includes all components explained in respective embodiments. Part of a certain embodiment may be replaced with components of another embodiment. A component of a certain embodiment may be added to a component of another embodiment. It is also possible to add, delete and replace part of components of respective embodiments with respect to part of components of other embodiments. Furthermore, the sample lifting and lowering device suitable to be mounted on an electronic microscope apparatus is explained the above embodiments, however, the sample lifting and lowering device explained in the above embodiments may be mounted on processing apparatuses such as a FIB (Focused Ion Beam) apparatus. Furthermore, the sample lifting and lowering device explained in the above embodiments may be applied to fields of various types of machine tools not using the charged particle beam.

REFERENCE SIGNS LIST

1 . . . base plate, 2 . . . lifting and lowering mechanism, 3 . . . support member, 4 . . . sample conveying mechanism, 12 . . . horizontal movement mechanism, 13 . . . middle wedge mechanism, 14 . . . upper wedge mechanism, 15 . . . vertical guide mechanism, 16A, 16B, 16C . . . , guide mechanism, 17 . . . direct-acting ultrasonic motor, 18 . . . friction plate, 20 . . . feed bolt, 21 . . . linear scale, 22 . . . linear scale head, 23 . . . wedge inclined angle, 24, 25 . . . ball screw portion, 30 . . . barycenter, 31A, 31B . . . circle, 32 . . . movement direction of wedge deceleration machine, 33 . . . extended line, 34 . . . arbitrary axis, 35 . . . triangle, 40 . . . synchronous controller, 41 . . . control device, 42 . . . motor driver, 43 . . . control parameter, 51 . . . rotary ultrasonic motor, 52 . . . coupling, 53 . . . screw shaft, 54 . . . bearing house, 55 . . . vertical guide mechanism, 100 . . . electronic microscope apparatus, 101 . . . electronic optical device, 102 . . . sample chamber, 103 . . . vacuum evacuation device, 104 . . . electron beam source, 105 . . . electron beam, 106 . . . electromagnetic lens, 107, . . . deflection electrode, 108 . . . sample, 109 . . . secondary electrons, 110 . . . secondary electron detector, 111 . . . controller, 112 . . . vacuum evacuation device, 113 . . . sample fixing stage, 114 . . . XY-plane stage, 115 . . . sample lifting and lowering device, 116 . . . bar mirror, 117 . . . laser length measuring gauge, 118 . . . driving device, 120 . . . working distance

The invention claimed is:
1. A charged particle beam apparatus comprising:
a charged particle source generating a charged particle beam to be irradiated to a sample;
a detection device detecting a signal generated from the sample by irradiation of the charged particle beam;
a horizontal movement mechanism moving the sample to an observation position;
a sample lifting and lowering device arranged above the horizontal movement mechanism; and
a chamber including the charged particle source, the detection device, the horizontal movement mechanism and the sample lifting and lowering device and maintaining an internal space in a reduced pressure environment,
wherein the sample lifting and lowering device includes first and second lifting and lowering mechanisms that lift and lower a sample stage to which the sample is fixed,
first and second driving devices that drive the first and second lifting and lowering mechanisms to be lifted and lowered individually, and
a controller that synchronizes lifting or lowering operations of the first and second lifting and lowering mechanisms by the first and second driving devices by first and second control signals, and
the first lifting and lowering mechanism includes a first deceleration mechanism generating a first drive output obtained by decelerating a first drive input given from the first driving device in a direction different from a direction of the input,
the second lifting and lowering mechanism includes a second deceleration mechanism generating a second drive output obtained by decelerating a second drive input given from the second driving device in a direction different from a direction of the input, and
directions of the first and second drive inputs are different from each other as well as are not on the same straight line.
2. The charged particle beam apparatus according to claim 1,
wherein the sample lifting and lowering device further includes a guide mechanism regulating a movement direction of the sample stage by lifting/lowering driving by the first and second lifting and lowering mechanisms in a vertical direction.
3. The charged particle beam apparatus according to claim 1,
wherein the first and second deceleration mechanisms are deceleration mechanisms using a wedge type.
4. The charged particle beam apparatus according to claim 1,
wherein the sample lifting and lowering device further includes a third lifting and lowering mechanism that lifts and lowers the sample stage together with the first and second lifting and lowering mechanisms,
a third driving device that drives the third lifting and lowering mechanism to be lifted and lowered individually, and
a controller that synchronizes a lifting or lowering operation of the third lifting and lowering mechanism by the third driving device by a third control signal, and
the third lifting and lowering mechanism includes a third deceleration mechanism generating a third drive output obtained by decelerating a third drive input given from the third driving device in a direction different from a direction of the input, and
directions of the first to third drive inputs are different from one another as well as are not on the same straight line.
5. The charged particle beam apparatus according to claim 4,
wherein, when a virtual circle passing positions where the first to third lifting and lowering mechanisms are arranged is determined, any of places where directions of the first to third drive inputs cross is positioned outside the virtual circle.
6. The charged particle beam apparatus according to claim 2,
wherein, when a virtual circle passing positions where the first and second lifting and lowering mechanisms and the guide mechanism are arranged is determined, a place where directions of the first and second drive inputs cross is positioned outside the virtual circle.
7. The charged particle beam apparatus according to claim 1,
wherein the sample lifting and lowering device further includes a third lifting and lowering mechanism that lifts and lowers the sample stage together with the first and second lifting and lowering mechanisms, and
a barycenter position of the sample stage is positioned inside a triangle having apexes corresponding to arrangement positions or the first, second and third lifting and lowering mechanisms.
8. The charged particle beam apparatus according to claim 2,
wherein a barycenter position of the sample stage is positioned inside a triangle having apexes corresponding to arrangement positions of the first and second lifting and lowering mechanisms and the guide mechanism.
9. The charged particle beam apparatus according to claim 1,
wherein a barycenter of the sample stage is positioned on a straight line passing arrangement positions of the first and second lifting and lowering mechanisms.
10. The charged particle beam apparatus according to claim 1,
wherein the first lifting and lowering mechanism further includes a first measurement device that measures a movement amount in a direction of the first drive input or a movement amount in a direction of the first drive output,
the second lifting and lowering mechanism further includes a second measurement device that measures a movement amount in a direction of the second drive input or a movement amount in a direction of the second drive output, and
the controller compares a measurement result of the first measurement device with a measurement result of the second measurement device to control lifting or lowering operations of the first and second lifting and lowering mechanisms.
11. The charged particle beam apparatus according to claim 1,
wherein any one of the first and second lifting and lowering mechanisms further includes a measurement device that measures a movement amount in a direction of the first or second drive input or a movement amount in a direction of the first or second drive output, and the controller controls a lifting or lowering operation of the other lifting and lowering mechanism in which the measurement device is not provided by using a measurement result of the measurement device as a reference.

12. A sample lifting and lowering device arranged above a horizontal movement mechanism, comprising:
   first and second lifting and lowering mechanisms that lift and lower a sample stage to which the sample is fixed;
   first and second driving devices that drive the first and second lifting and lowering mechanisms to be lifted and lowered individually; and
   a controller that synchronizes lifting or lowering operations of the first and second lifting and lowering mechanisms by the first and second driving devices by first and second control signals,
   wherein the first lifting and lowering mechanism includes a first deceleration mechanism generating a first drive output obtained by decelerating a first drive input given from the first driving device in a direction different from a direction of the input,
   the second lifting and lowering mechanism includes a second deceleration mechanism generating a second drive output obtained by decelerating a second drive input given from the second driving device in a direction different from a direction of the input, and
   directions of the first and second drive inputs are different from each other as well as are not on the same straight line.

13. The sample lifting and lowering device according to claim 12, further comprising:
   a guide mechanism regulating a movement direction of the sample stage by lifting or lowering driving by the first and second lifting and lowering mechanisms in a vertical direction.

14. The sample lifting and lowering device according to claim 12, further comprising:
   a third lifting and lowering mechanism that lifts and lowers the sample stage together with the first and second lifting and lowering mechanisms.

15. The sample lifting and lowering device according to claim 12,
   wherein any one or both of the first and second lifting and lowering mechanisms further includes a measurement device that measures a movement amount in a direction of a drive input or a movement amount in a direction of a drive output, and
   the controller controls lifting or lowering operations of the first and second lifting and lowering mechanisms based on a measurement result by the measurement device.

* * * * *